(12) United States Patent
Kim et al.

(10) Patent No.: US 12,501,629 B2
(45) Date of Patent: Dec. 16, 2025

(54) THREE-DIMENSIONAL SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: Jiwon Kim, Suwon-si (KR); Dohyung Kim, Suwon-si (KR); Jiyoung Kim, Suwon-si (KR); Sukkang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 390 days.

(21) Appl. No.: 18/323,440

(22) Filed: May 25, 2023

(65) Prior Publication Data

US 2024/0138157 A1 Apr. 25, 2024
US 2024/0237362 A9 Jul. 11, 2024

(30) Foreign Application Priority Data

Oct. 20, 2022 (KR) .......................... 10-2022-0135329

(51) Int. Cl.
*H01L 25/065* (2023.01)
*H01L 23/00* (2006.01)
(Continued)

(52) U.S. Cl.
CPC ............. *H10B 80/00* (2023.02); *H01L 24/08* (2013.01); *H01L 24/80* (2013.01);
(Continued)

(58) Field of Classification Search
CPC ......... H10B 80/00; H10B 41/10; H01L 24/08; H01L 24/80; H01L 2224/08145;
(Continued)

(56) References Cited

U.S. PATENT DOCUMENTS 10,283,452 B2  5/2019  Zhu et al.
10,354,987 B1  7/2019  Mushiga et al.
(Continued)

FOREIGN PATENT DOCUMENTS

CN  111370416 A  7/2020
CN  111933647 A  11/2020
(Continued)

*Primary Examiner* — Thanh Y. Tran
(74) *Attorney, Agent, or Firm* — Wolf, Greenfield & Sacks, P.C.

(57) ABSTRACT

A three-dimensional semiconductor memory device may include a peripheral structure and a cell structure on the peripheral structure. The cell structure may include a substrate having first and second surfaces, which are opposite to each other, a stack including gate electrodes, which are stacked on the first surface of the substrate, an insulating layer on the second surface of the substrate, a penetration contact plug penetrating the first surface of the substrate, a first gapfill conductive pattern provided to penetrate the second surface of the substrate and the insulating layer and spaced apart from the penetration contact plug, a second gapfill conductive pattern provided to penetrate the second surface of the substrate and the insulating layer and connected to the penetration contact plug, a first gapfill spacer between the first gapfill conductive pattern and the substrate, and a second gapfill spacer between the second gapfill conductive pattern and the substrate.

20 Claims, 22 Drawing Sheets

(51) Int. Cl.
*H01L 25/00* (2006.01)
*H01L 25/18* (2023.01)
*H10B 80/00* (2023.01)

(52) U.S. Cl.
CPC .......... *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ................ H01L 25/18; H01L 25/50; H01L 2224/80895; H01L 2224/80896; H01L 2924/1431; H01L 2924/14511; H01L 2225/06506; H01L 2225/0651; H01L 2225/06562; H01L 2225/06586
See application file for complete search history.

(56) References Cited

U.S. PATENT DOCUMENTS

| | | | |
|---|---|---|---|
| 2021/0233923 A1 | 7/2021 | Oh | |
| 2021/0320094 A1 | 10/2021 | Zhang et al. | |
| 2021/0407968 A1 | 12/2021 | Kim et al. | |
| 2022/0045045 A1* | 2/2022 | Lee | H10B 41/10 |
| 2022/0068850 A1* | 3/2022 | Akou | G11C 7/1084 |
| 2022/0093614 A1 | 3/2022 | Liu et al. | |
| 2022/0108963 A1 | 4/2022 | Hwang et al. | |
| 2022/0181284 A1* | 6/2022 | Shin | H01L 25/50 |
| 2023/0138478 A1* | 5/2023 | Choi | H10B 43/40 257/777 |
| 2023/0178505 A1* | 6/2023 | Lee | H01L 25/0657 257/296 |

FOREIGN PATENT DOCUMENTS

| | | |
|---|---|---|
| CN | 112614850 A | 4/2021 |
| KR | 10-2022-0045300 A | 4/2022 |

* cited by examiner

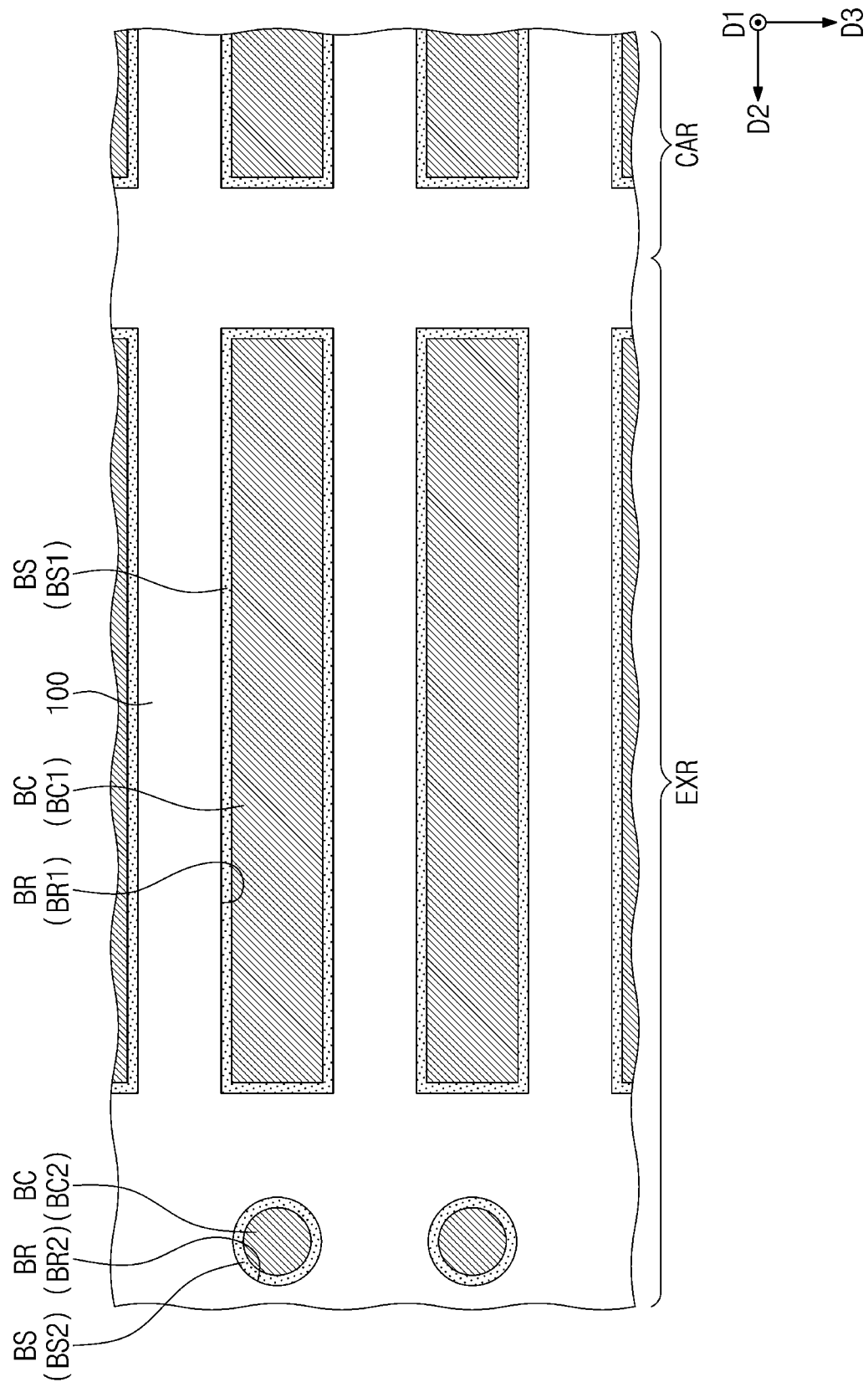

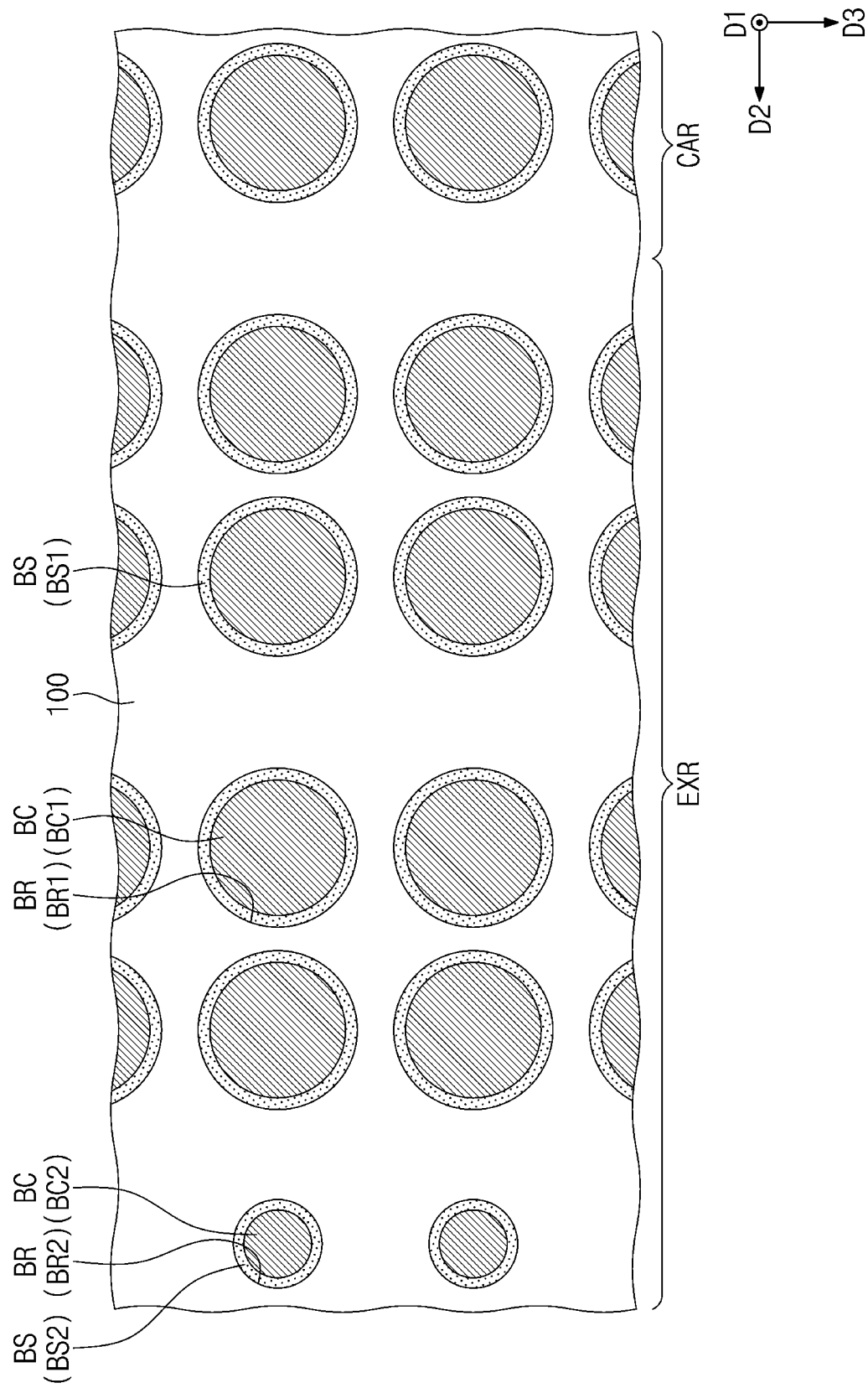

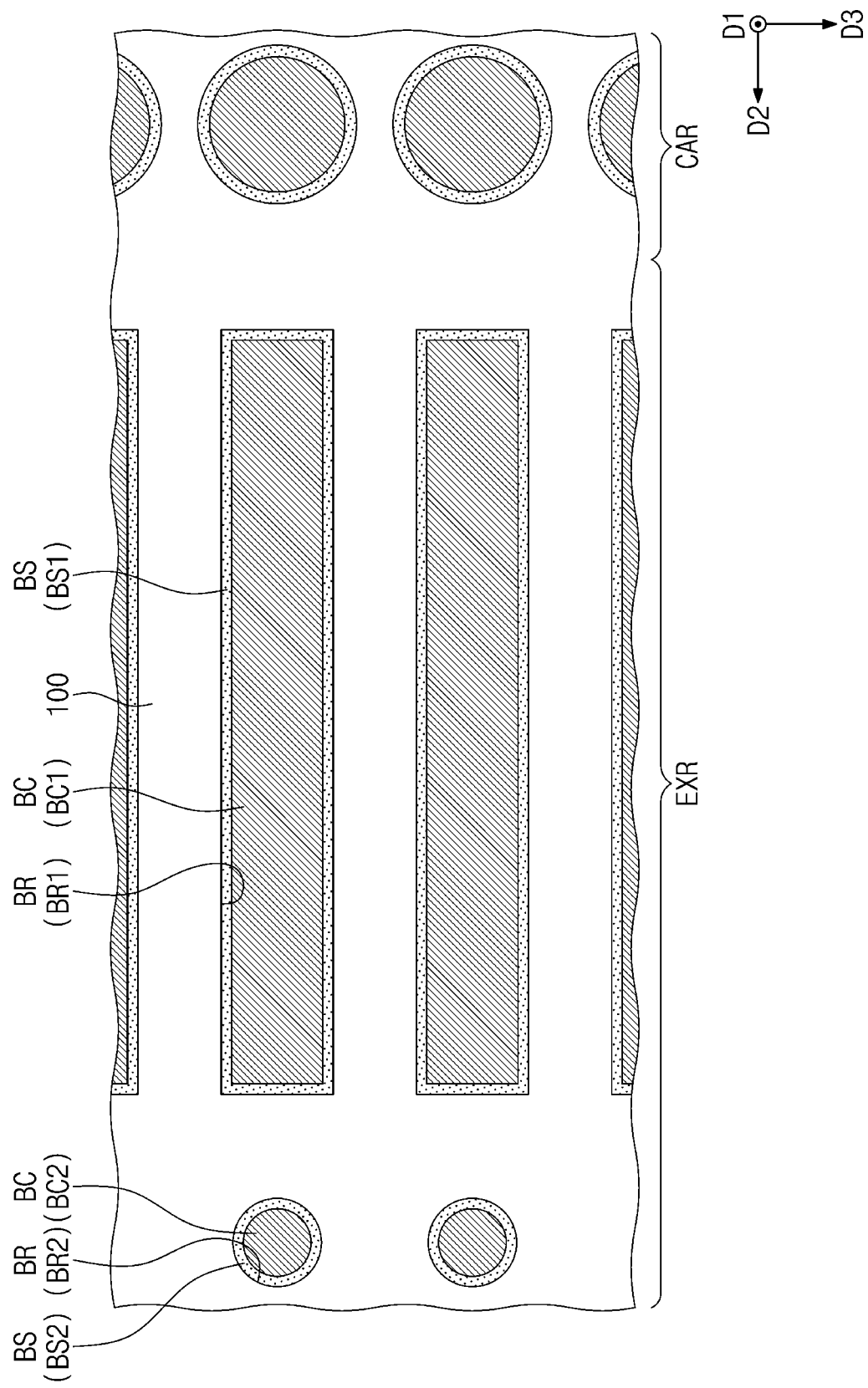

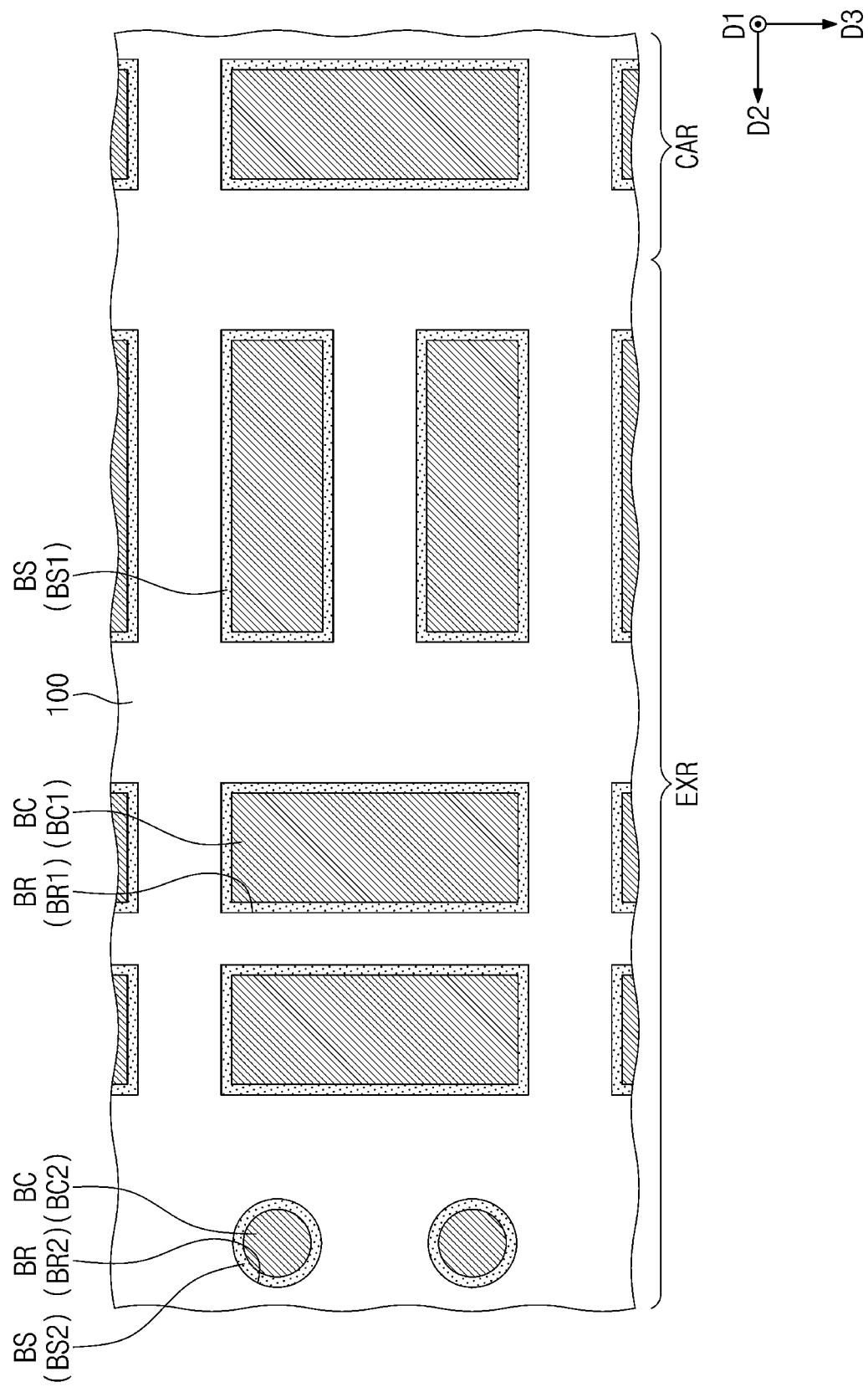

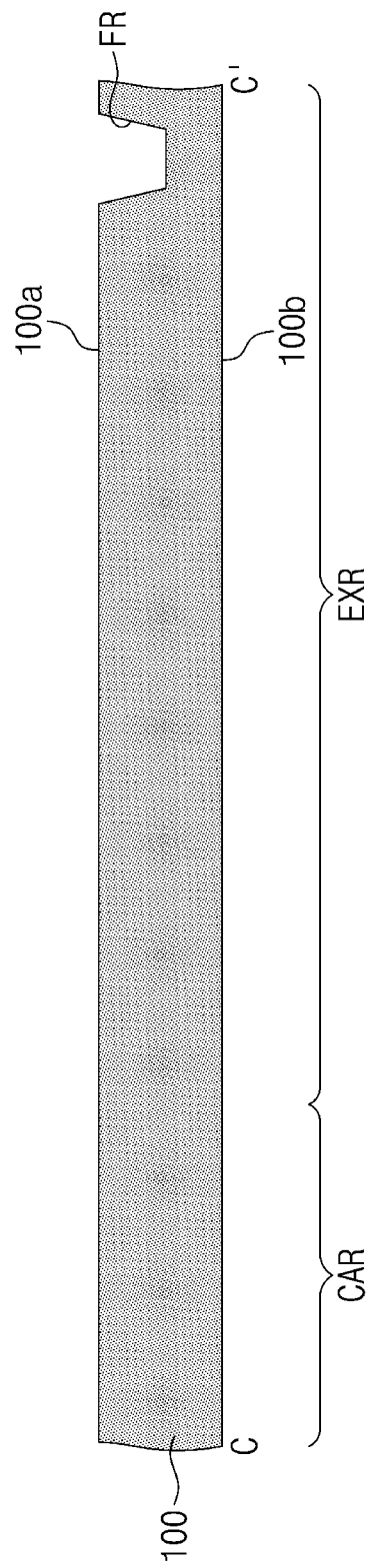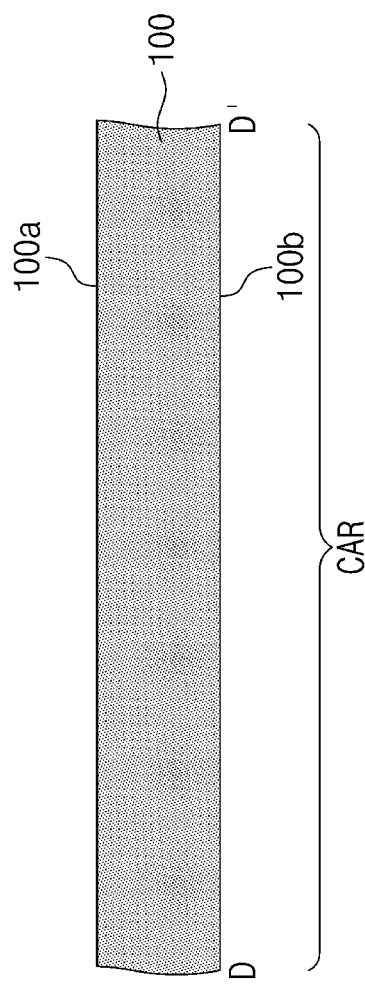

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2022-0135329, filed on Oct. 20, 2022, in the Korean Intellectual Property Office, the entire contents of which are hereby incorporated by reference.

BACKGROUND OF THE INVENTION

The present disclosure relates to a three-dimensional semiconductor memory device and an electronic system including the same, and in particular, a three-dimensional semiconductor memory device including a peripheral circuit structure and a cell array structure, which are bonded to each other through bonding pads, and an electronic system including the same.

A semiconductor device capable of storing a large amount of data is used as a data storage of an electronic system. Higher integration of semiconductor devices may be desired to satisfy consumer demands for large data storing capacity, superior performance, and inexpensive prices. In the case of two-dimensional or planar semiconductor devices, since their integration may be mainly determined by the area occupied by a unit memory cell, integration may be greatly influenced by the level of a fine pattern forming technology. However, the extremely expensive process equipment used to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

Example embodiments of the inventive concept provide a three-dimensional semiconductor memory device with improved electrical characteristics.

Example embodiments of the inventive concept provide a three-dimensional semiconductor memory device that can be easily fabricated.

According to some embodiments of the inventive concept, a three-dimensional semiconductor memory device may include a peripheral circuit structure on a first substrate and a cell array structure on the peripheral circuit structure. The cell array structure may include a second substrate having a first surface and a second surface, which are opposite to each other, a stack including gate electrodes, which are stacked on the first surface of the second substrate in a first direction, an insulating layer on the second surface of the second substrate, a penetration contact plug extending through the first surface of the second substrate, a first gapfill conductive pattern extending through the second surface of the second substrate and the insulating layer and spaced apart from the penetration contact plug, a second gapfill conductive pattern extending through the second surface of the second substrate and the insulating layer and connected to the penetration contact plug, a first gapfill spacer between the first gapfill conductive pattern and the second substrate, and a second gapfill spacer between the second gapfill conductive pattern and the second substrate.

According to some embodiments of the inventive concept, a three-dimensional semiconductor memory device may include a peripheral circuit structure on a first substrate and a cell array structure on the peripheral circuit structure. The cell array structure may include a second substrate having a first surface and a second surface, which are opposite to each other, a stack including gate electrodes, which are stacked on the first surface of the second substrate in a first direction, an insulating layer on the second surface of the second substrate, and a gapfill conductive pattern extending through the second surface of the second substrate and the insulating layer. A side surface of the gapfill conductive pattern may be spaced apart from the second substrate, and a bottom surface of the gapfill conductive pattern may be in contact with the second substrate.

According to some embodiments of the inventive concept, an electronic system may include a three-dimensional semiconductor memory device including a peripheral circuit structure on a first substrate and a cell array structure on the peripheral circuit structure, and a controller, which is electrically connected to the three-dimensional semiconductor memory device through an input/output pad and is configured to control the three-dimensional semiconductor memory device. The cell array structure may include a second substrate having a first surface and a second surface, which are opposite to each other, a stack including gate electrodes, which are stacked on the first surface of the second substrate in a first direction, an insulating layer on the second surface of the second substrate, a penetration contact plug extending through the first surface of the second substrate, a first gapfill conductive pattern extending through the second surface of the second substrate and the insulating layer and spaced apart from the penetration contact plug, a second gapfill conductive pattern extending through the second surface of the second substrate and the insulating layer and connected to the penetration contact plug, a first gapfill spacer between the first gapfill conductive pattern and the second substrate, and a second gapfill spacer between the second gapfill conductive pattern and the second substrate.

BRIEF DESCRIPTION OF THE DRAWINGS

FIGS. 9A to 9D are plan views illustrating a three-dimensional semiconductor memory device according to some embodiments of the inventive concept.

FIGS. 10A, 10B, 11A, 11B, 12A, 12B, 13A, 13B and 14 are sectional views illustrating a method of fabricating a three-dimensional semiconductor memory device, according to some embodiments of the inventive concept.

DETAILED DESCRIPTION

Hereinafter, a three-dimensional semiconductor memory device according to some embodiments of the inventive concept, an electronic system including the same, and a method of fabricating a three-dimensional semiconductor memory device will be described in more detail with reference to the accompanying drawings.

Figure 1:
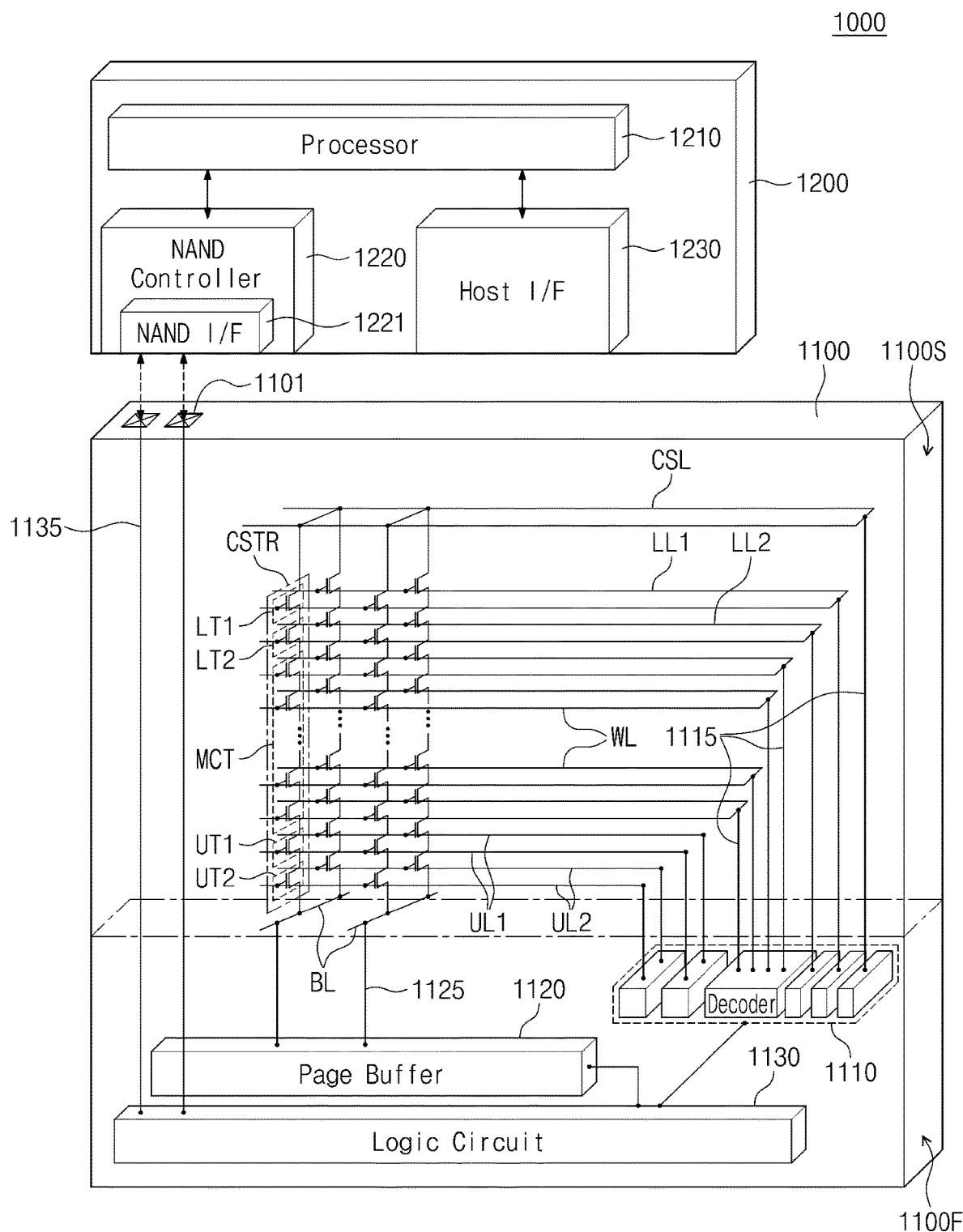
FIG. 1 is a diagram schematically illustrating an electronic system including a three-dimensional semiconductor memory device according to some embodiments of the inventive concept.

FIG. 1 is a diagram schematically illustrating an electronic system including a three-dimensional semiconductor memory device according to some embodiments of the inventive concept.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including the storage device. For example, the electronic system 1000 may be a solid state drive (SSD) device, a universal serial bus (USB), a computing system, a medical system, or a communication system, in which at least one three-dimensional semiconductor memory device 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. However, unlike that illustrated in the drawings, the first region 1100F may be disposed beside the second region 1100S. The first region 1100F may be a peripheral circuit region, which includes a decoder circuit 1110, a page buffer 1120, and a logic circuit 1130. The second region 1100S may be a memory cell region, which includes bit lines BL, a common source line CSL, word lines WL, first lines LL1 and LL2, second lines UL1 and UL2, and memory cell strings CSTR between the bit lines BL and the common source line CSL.

In the second region 1100S, each of the memory cell strings CSTR may include first transistors LT1 and LT2 adjacent to the common source line CSL, second transistors UT1 and UT2 adjacent to the bit lines BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to embodiments. The memory cell strings CSTR may be positioned between the common source line CSL and the first region 1100F.

For example, the second transistors UT1 and UT2 may include a string selection transistor, and the first transistors LT1 and LT2 may include a ground selection transistor. The first lines LL1 and LL2 may serve as gate electrodes of the first transistors LT1 and LT2. The word lines WL may serve as gate electrodes of the memory cell transistors MCT, and the second lines UL1 and UL2 may serve as gate electrodes of the second transistors UT1 and UT2.

For example, the first transistors LT1 and LT2 may include a first erase control transistor LT1 and a ground selection transistor LT2, which are connected in series. For example, the second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit lines BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which is performed on at least one memory cell transistor that is selected from the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which is extended from the first region 1100F to the second region 1100S.

The controller 1200 may include a processor 1210, a NAND controller 1220, and a host interface 1230. In some embodiments, the electronic system 1000 may include a plurality of three-dimensional semiconductor memory devices 1100, which are controlled by the controller 1200.

The processor 1210 may control overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands to control the three-dimensional semiconductor memory device 1100, data to be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the three-dimensional semiconductor memory device 1100 in response to the control command.

Figure 2:
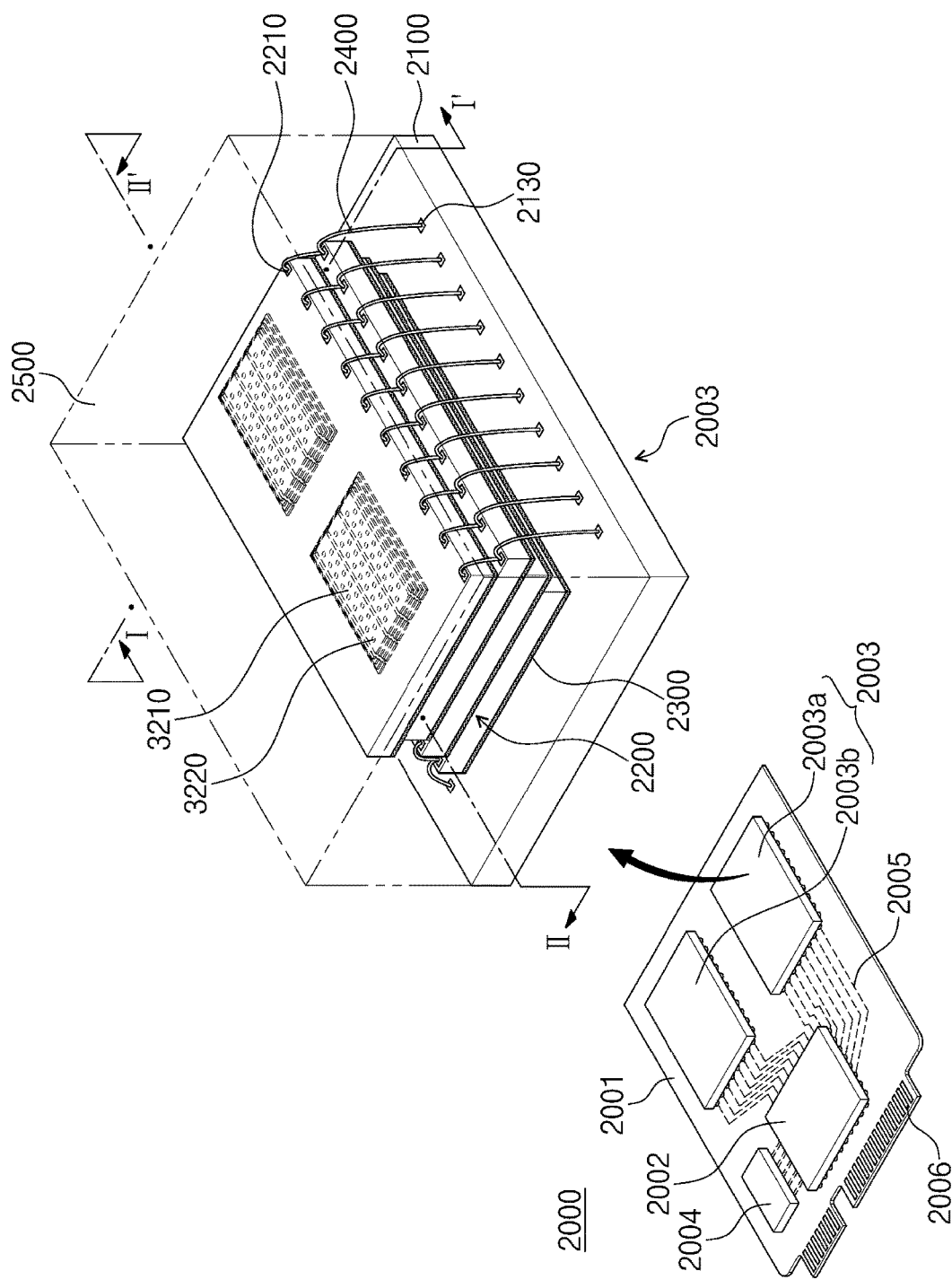
FIG. 2 is a perspective view schematically illustrating an electronic system including a three-dimensional semiconductor memory device according to some embodiments of the inventive concept.

FIG. 2 is a perspective view schematically illustrating an electronic system including a three-dimensional semiconductor memory device according to some embodiments of the inventive concept.

Referring to FIG. 2, an electronic system 2000 may include a main substrate 2001 and a controller 2002, one or more semiconductor packages 2003, and a DRAM 2004, which are mounted on the main substrate 2001. The semiconductor package 2003 and the DRAM 2004 may be connected to the controller 2002 and may be connected to each other by interconnection patterns 2005, which are provided in the main substrate 2001.

The main substrate 2001 may include a connector 2006, which includes a plurality of pins coupled to an external host. In the connector 2006, the number and the arrangement of the pins may be changed depending on a communication interface between the electronic system 2000 and an external host. For example, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In some embodiments, the electronic system 2000 may be driven by an electric power, which is supplied from the external host through the connector 2006. The electronic system 2000 may further include a power management integrated circuit (PMIC) that is used to separately supply the electric power, which is provided from the external host, to the controller 2002 and the semiconductor package 2003.

The controller 2002 may control a writing or reading operation on the semiconductor package 2003 and may improve an operation speed of the electronic system 2000.

The DRAM 2004 may be a buffer memory that is used to relieve technical difficulties caused by a difference in speed between the semiconductor package 2003, which serves as a data storage device, and an external host. In some embodiments, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200, which are provided on the package substrate 2100, adhesive layers 2300, which are respectively disposed in bottom surfaces of the semiconductor chips 2200, connection structures 2400, which are used to electrically connect the semiconductor chips 2200 to the package substrate 2100, and a molding layer 2500, which is provided on the package substrate 2100 to cover the semiconductor chips 2200 and the connection structures 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stacks 3210 and memory channel structures 3220. Each of the semiconductor chips 2200 may include a three-dimensional semiconductor memory device, which will be described below.

The connection structures 2400 may be, for example, bonding wires, which are used to electrically connect the input/output pads 2210 to the package upper pads 2130. That is, in each of the first and second semiconductor packages 2003a and 2003b, the semiconductor chips 2200 may be electrically connected to each other in a bonding wire manner and may be electrically connected to the package upper pads 2130 of the package substrate 2100. In some embodiments, the semiconductor chips 2200 in each of the first and second semiconductor packages 2003a and 2003b may be electrically connected by penetration electrodes (e.g., through silicon vias), not by a wire bonding method using the connection structures 2400.

Unlike that illustrated in FIG. 2, the controller 2002 and the semiconductor chips 2200 may be included in a single package. In some embodiments, the controller 2002 and the semiconductor chips 2200 may be mounted on a separate interposer substrate, not on the main substrate 2001, and may be connected to each other through interconnection lines, which are provided in the interposer substrate.

Figure 3:
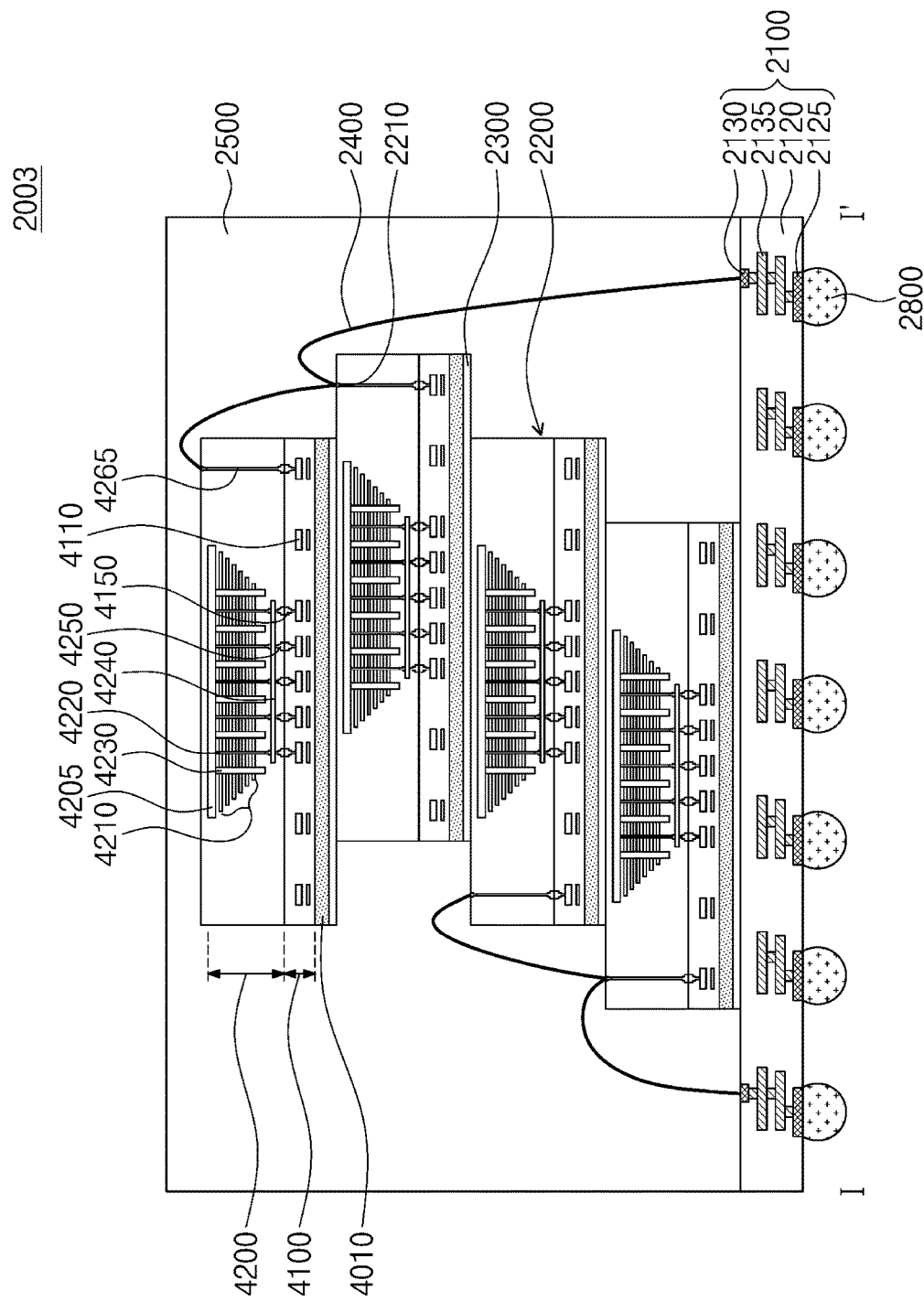
FIGS. 3 and 4 are sectional views, which are respectively taken along lines I-I' and II-II' of FIG. 2 to illustrate a semiconductor package including a three-dimensional semiconductor memory device according to some embodiments of the inventive concept.
Figure 4:
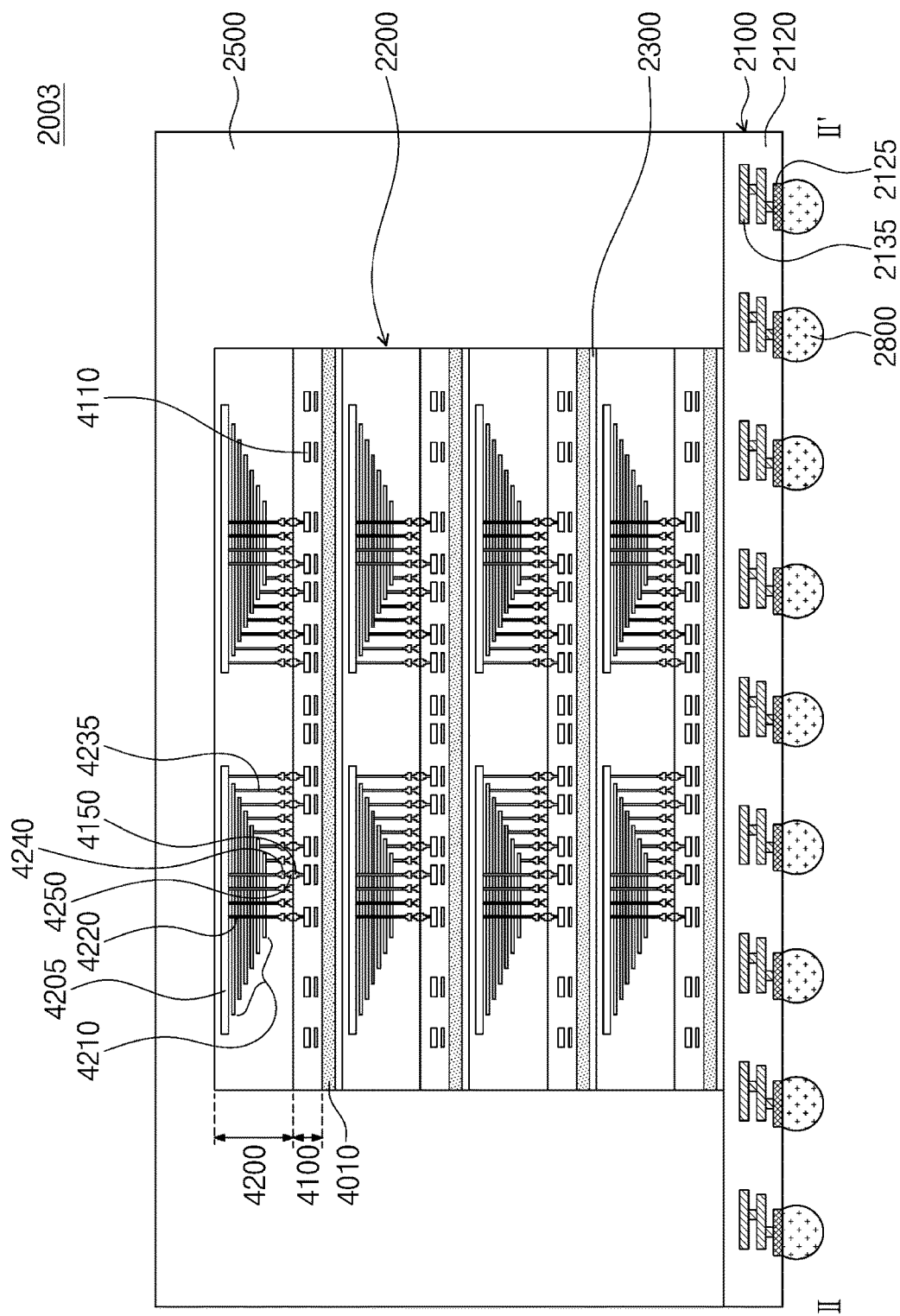

FIGS. 3 and 4 are sectional views, which are respectively taken along lines I-I' and II-II' of FIG. 2 to illustrate a semiconductor package including a three-dimensional semiconductor memory device according to some embodiments of the inventive concept.

Referring to FIGS. 3 and 4, the semiconductor package 2003 may include the package substrate 2100, the semiconductor chips 2200 on the package substrate 2100, and the molding layer 2500 covering the package substrate 2100 and the semiconductor chips 2200.

The package substrate 2100 may include a package substrate body portion 2120, upper pads 2130, which are provided on a top surface of the package substrate body portion 2120 and are exposed to the outside of the package substrate body portion 2120 near the top surface, lower pads 2125, which are provided on a bottom surface of the package substrate body portion 2120 or are exposed to the outside of the package substrate body portion 2120 near the bottom surface, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000, which is shown in FIG. 2, through conductive connecting portions 2800.

Referring to FIGS. 2 and 3, the semiconductor chips 2200 may be provided to have side surfaces, which are not aligned to each other, and other side surfaces, which are aligned to each other. The semiconductor chips 2200 may be electrically connected to each other through the connection structures 2400, which are provided in the form of bonding wires. Each of the semiconductor chips 2200 may include substantially the same elements.

Each of the semiconductor chips 2200 may include a semiconductor substrate 4010, a first structure 4100 on the semiconductor substrate 4010, and a second structure 4200 on the first structure 4100. The second structure 4200 may be connected to the first structure 4100 in a wafer bonding manner.

The first structure 4100 may include peripheral circuit interconnection lines 4110 and first bonding pads 4150. The second structure 4200 may include a common source line 4205, a gate stack 4210, which is provided between the common source line 4205 and the first structure 4100, memory channel structures 4220 and separation structures 4230, which are provided to penetrate the gate stack 4210, and second bonding pads 4250, which are electrically and respectively connected to the memory channel structures 4220 and the word lines WL (e.g., see FIG. 1) of the gate stack 4210. For example, the second bonding pads 4250 may be electrically and respectively connected to the memory channel structures 4220 and the word lines WL through bit lines 4240, which are electrically connected to the memory channel structures 4220, and gate interconnection lines 4235, which are electrically connected to the word lines WL. The first bonding pads 4150 of the first structure 4100 and the second bonding pads 4250 of the second structure 4200 may be in contact with each other and may be coupled to each other. The coupling portions between the first bonding pads 4150 and the second bonding pads 4250 may be formed of or include, for example, copper (Cu).

Each of the semiconductor chips 2200 may further include the input/output pad 2210 and an input/output interconnection line 4265 below the input/output pad 2210. The input/output interconnection line 4265 may be electrically connected to some of the second bonding pads 4250 and some of the peripheral circuit interconnection lines 4110.

Figure 5A:
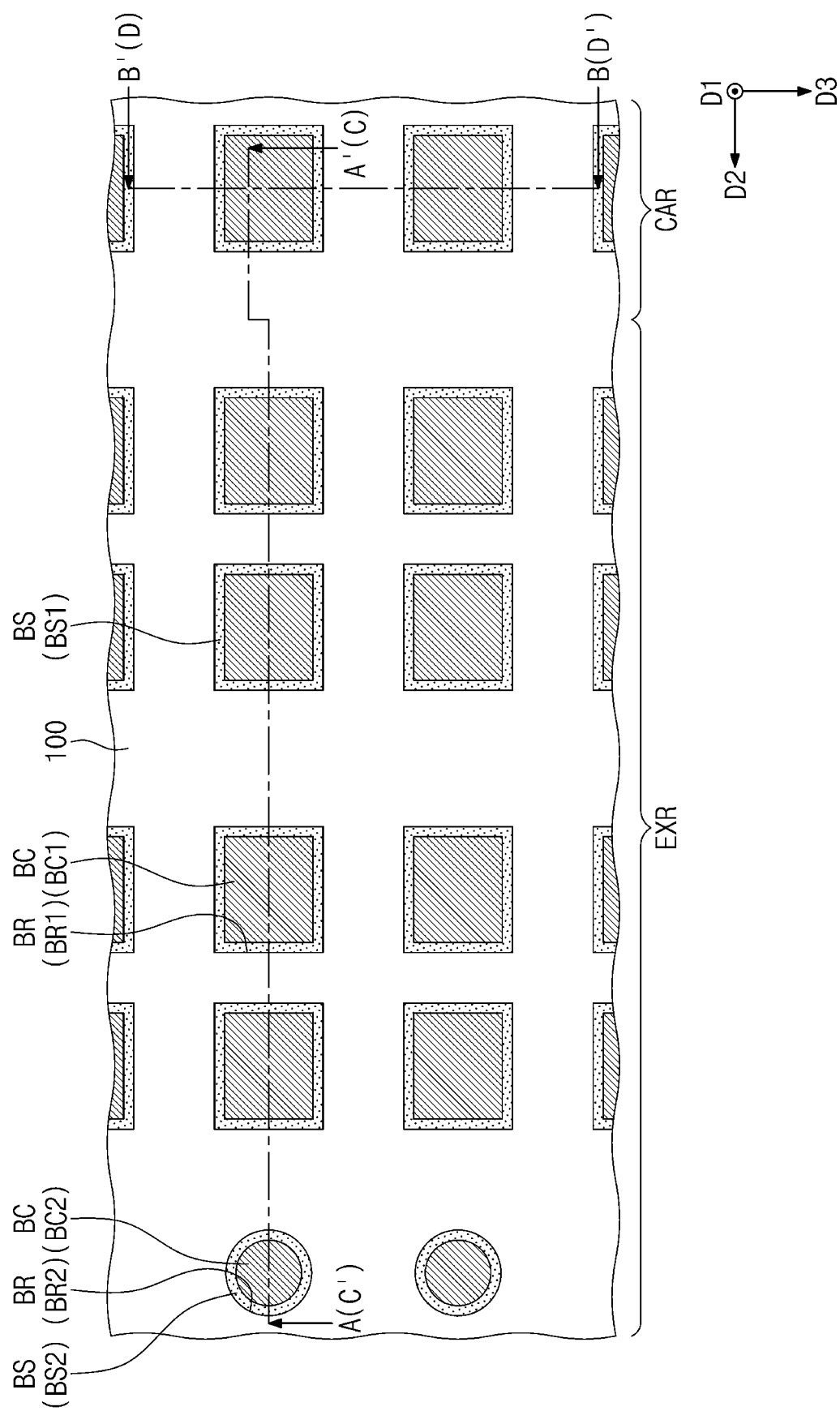
FIGS. 5A and 5B are sectional views, which are taken at two different levels to illustrate a three-dimensional semiconductor memory device according to some embodiments of the inventive concept.
Figure 5B:
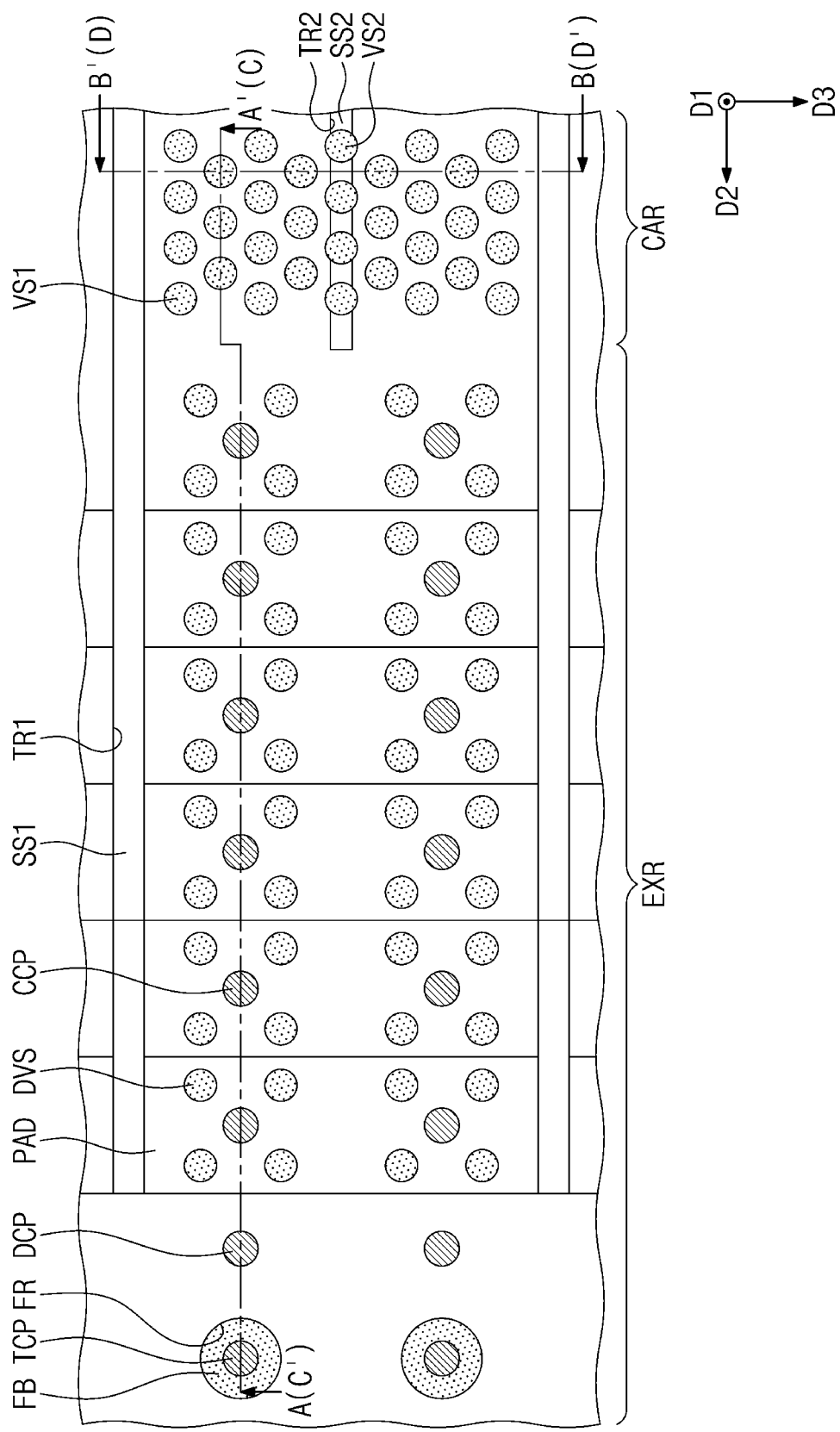
Figure 6A:
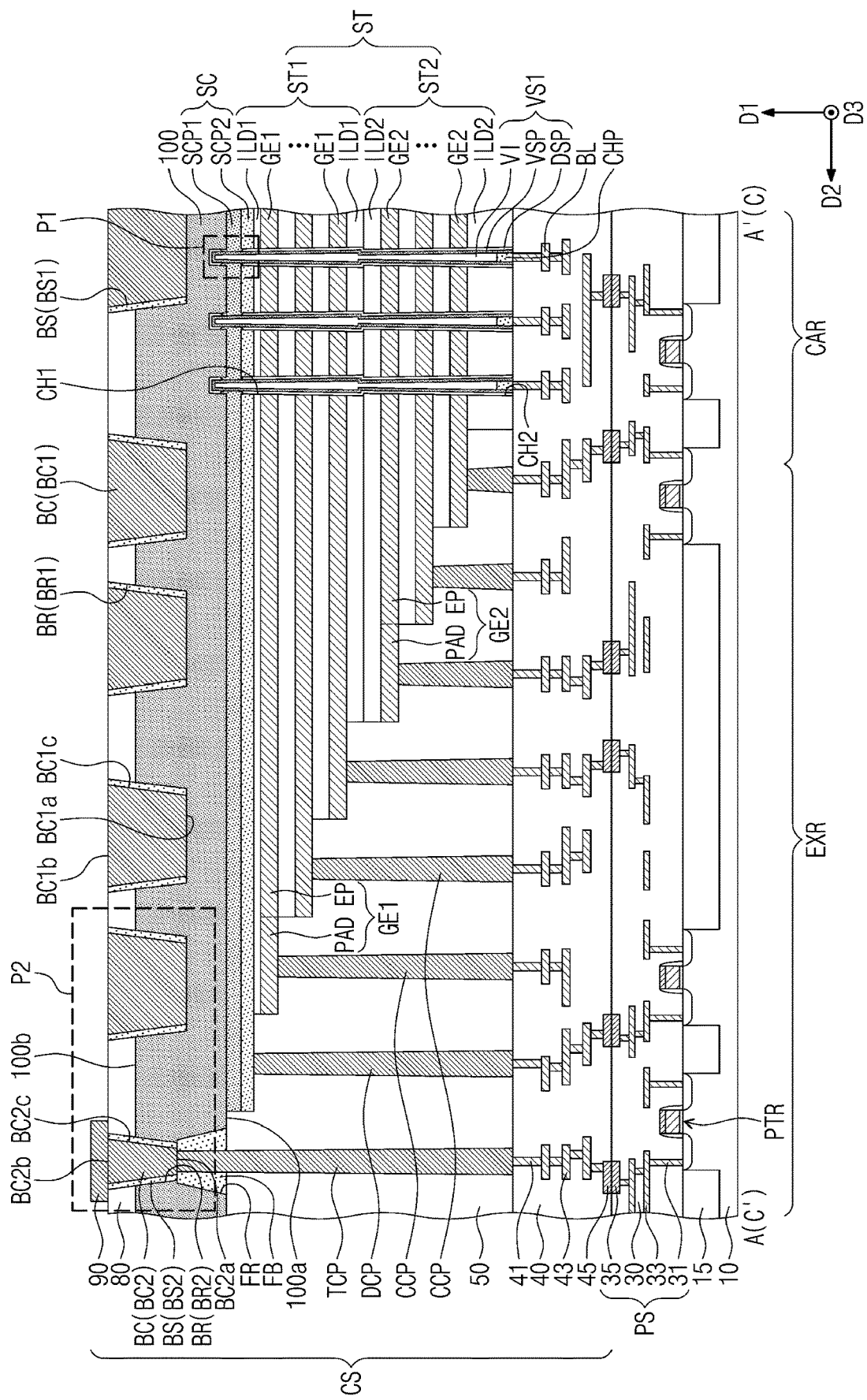
FIGS. 6A and 6B are sectional views, which are taken along lines A-A' and B-B' of FIG. 5A or 5B.
Figure 6B:
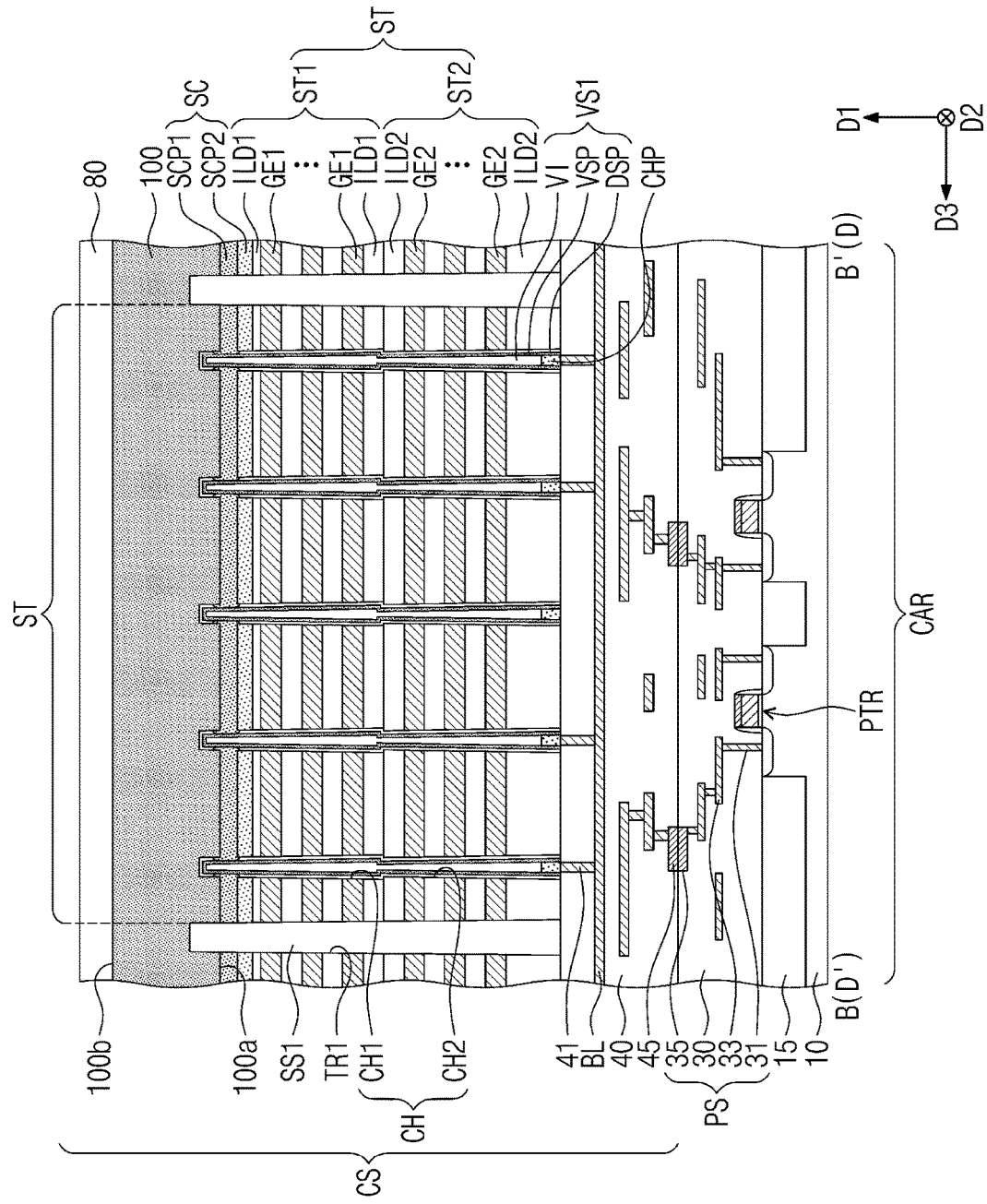
Figure 7:
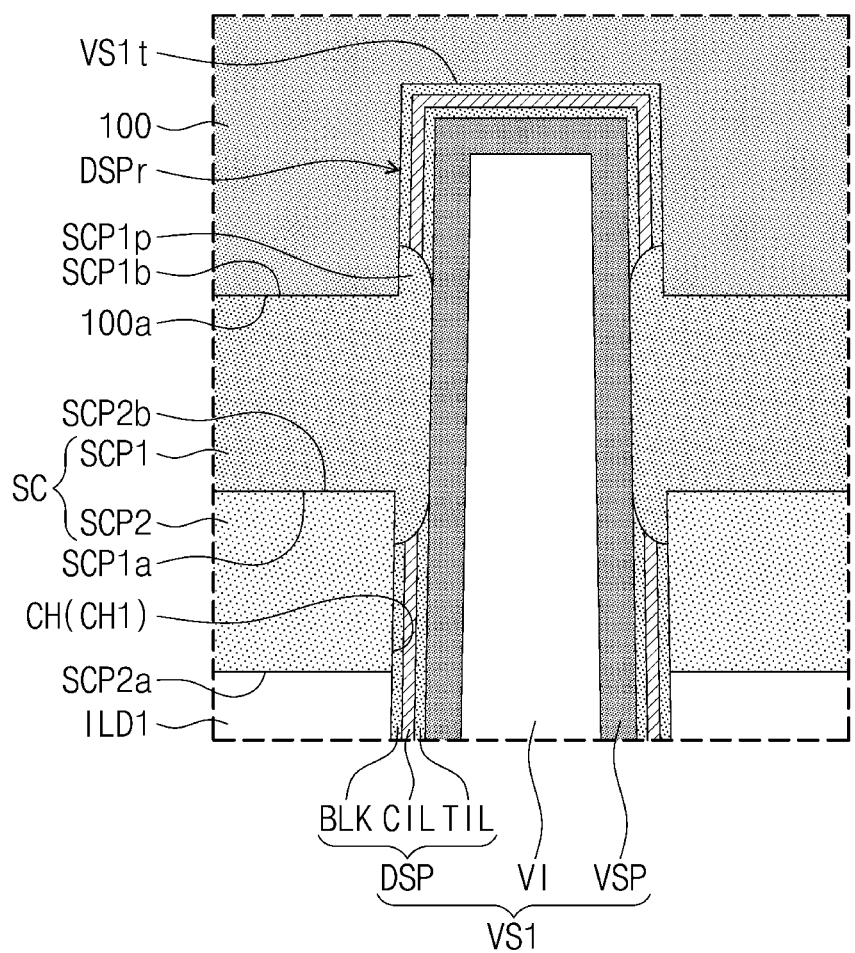
FIG. 7 is an enlarged sectional view illustrating a portion P1' of FIG. 6A according to some embodiments of the inventive concept.

FIGS. 5A and 5B are sectional views, which are taken at two different levels to illustrate a three-dimensional semiconductor memory device according to some embodiments of the inventive concept. FIGS. 6A and 6B are sectional views, which are taken along lines A-A' and B-B' of FIG. 5A or 5B. FIG. 7 is an enlarged sectional view illustrating a portion 'P1' of FIG. 6A according to some embodiments of the inventive concept. FIGS. 8A to 8D are enlarged sectional views, each of which illustrates a portion 'P2' of FIG. 6A according to some embodiments of the inventive concept.

Referring to FIGS. 5A to 6B, a three-dimensional semiconductor memory device may include a first substrate 10, a peripheral circuit structure PS on the first substrate 10, and a cell array structure CS on the peripheral circuit structure PS. The first substrate 10 may correspond to the semiconductor substrate 4010 of FIGS. 3 and 4. The peripheral circuit structure PS may correspond to the first structure 4100 of FIGS. 3 and 4. The cell array structure CS may correspond to the second structure 4200 of FIGS. 3 and 4.

The cell array structure CS may be bonded to the peripheral circuit structure PS, and thus, the three-dimensional semiconductor memory device according to some embodiments of the inventive concept may have an increased cell capacity per a unit area. In some embodiments, the peripheral circuit structure PS and the cell array structure CS may be separately fabricated and then may be bonded to each other, and in this case, it may be possible to reduce or prevent damage to peripheral transistors PTR by various thermal treatment processes and thereby to improve electrical and reliability characteristics of the three-dimensional semiconductor memory device.

In some embodiments, the first substrate 10 may be a silicon substrate, a silicon-germanium substrate, a germanium substrate, or a structure including a single-crystalline silicon substrate and a single-crystalline epitaxial layer grown therefrom. The first substrate 10 may have a top surface orthogonal to a first direction D1. The top surface of the first substrate 10 may be parallel to a second direction D2 and a third direction D3, which are not parallel to each other. For example, the first to third directions D1, D2, and D3 may be orthogonal to each other. A device isolation layer 15 may be provided in the first substrate 10. The device isolation layer 15 may define an active region of the first substrate 10.

The peripheral circuit structure PS may include the peripheral transistors PTR on the first substrate 10, peripheral contact plugs 31, peripheral circuit interconnection lines 33 electrically connected to the peripheral transistors PTR through the peripheral contact plugs 31, first bonding pads 35 electrically connected to peripheral circuit interconnection lines 33, and a first insulating layer 30 enclosing them. The peripheral transistors PTR may be provided on the active region of the first substrate 10. The peripheral circuit interconnection lines 33 may correspond to the peripheral circuit interconnection lines 4110 of FIGS. 3 and 4, the first bonding pads 35 may correspond to the first bonding pads 4150 of FIGS. 3 and 4.

As a height in the first direction D1 increases, widths of the peripheral contact plugs 31 in the second or third direction D2 or D3 may increase. The peripheral contact plugs 31 and the peripheral circuit interconnection lines 33 may be formed of or include at least one of conductive materials (e.g., metallic materials).

In some embodiments, the peripheral transistors PTR may constitute at least one of the decoder circuit 1110, the page buffer 1120, and the logic circuit 1130 of FIG. 1. The peripheral circuit interconnection lines 33 and the first bonding pads 35 may be electrically connected to the peripheral transistors PTR through peripheral contact plugs 31. Each of the peripheral transistors PTR may be, for example, an NMOS transistor or a PMOS transistor.

The first insulating layer 30 may be provided on the first substrate 10. The first insulating layer 30 on the first substrate 10 may cover the peripheral transistors PTR, the peripheral contact plugs 31, and the peripheral circuit interconnection lines 33. The first insulating layer 30 may be a multi-layered structure including a plurality of insulating layers. For example, the first insulating layer 30 may be formed of or include at least one of silicon oxide, silicon nitride, silicon oxynitride, or low-k dielectric materials. The first insulating layer 30 may not cover top surfaces of the first bonding pads 35. A top surface of the first insulating layer 30 may be substantially coplanar with the top surfaces of the first bonding pads 35.

The cell array structure CS may be provided on the peripheral circuit structure PS. The cell array structure CS may include second bonding pads 45, bit lines BL, a stack ST, and a second substrate 100. The cell array structure CS may include a cell array region CAR and a cell array contact region EXR. The cell array contact region EXR may be extended from the cell array region CAR in the second direction D2 or an opposite direction of the second direction D2.

The second bonding pads 45, the bit lines BL, the stack ST, and the second substrate 100 may correspond to the second bonding pads 4250, the bit lines 4240, the gate stack 4210, and the common source line 4205, respectively, of FIGS. 3 and 4.

The second bonding pads 45, connection contact plugs 41, connection circuit interconnection lines 43, and a second insulating layer 40 enclosing them may be provided on the first insulating layer 30. Here, the second bonding pads 45 may be in contact with the first bonding pads 35 of the peripheral circuit structure PS, and the connection circuit interconnection lines 43 may be electrically connected to the second bonding pads 45 through the connection contact plugs 41.

The second insulating layer 40 may be a multi-layered structure including a plurality of insulating layers. For example, the second insulating layer 40 may be formed of or include at least one of silicon oxide, silicon nitride, silicon oxynitride, or low-k dielectric materials.

As a height in the first direction D1 increases, widths of the connection contact plugs 41 in the second or third direction D2 or D3 may decrease. The connection contact plugs 41 and the connection circuit interconnection lines 43 may be formed of or include at least one of conductive materials (e.g., metallic materials).

Some of the connection contact plugs 41 may connect the bit lines BL to first vertical channel structures VS1, which will be described below. In some embodiments, each of the bit lines BL may be extended in the third direction D3 and may be spaced apart from each other in the second direction D2. The bit lines BL may be formed of or include at least one of conductive materials (e.g., metallic materials).

The second insulating layer 40 may not cover bottom surfaces of the second bonding pads 45. A bottom surface of the second insulating layer 40 may be substantially coplanar with the bottom surfaces of the second bonding pads 45. The bottom surface of each of the second bonding pads 45 may be in direct contact with the top surface of a corresponding one of the first bonding pads 35. The first and second bonding pads 35 and 45 may be formed of or include at least one of metallic materials (e.g., copper (Cu), tungsten (W), aluminum (Al), nickel (Ni), or tin (Sn)). As an example, the first and second bonding pads 35 and 45 may be formed of or include copper (Cu). The first and second bonding pads 35 and 45 may be connected to each other without any interface therebetween and may form a single object (e.g., a unitary structure). The side surfaces of the first and second bonding pads 35 and 45 are illustrated to be aligned to each other, but the inventive concept is not limited to this example. For example, the side surfaces of the first and second bonding pads 35 and 45 may be spaced apart from each other, when viewed in a plan view.

The stack ST and a third insulating layer 50 may be provided on the second insulating layer 40. The third insulating layer 50 may be provided to enclose the stack ST. The third insulating layer 50 may have a multi-layered structure including a plurality of insulating layers. The third insulating layer 50 may be formed of or include at least one of silicon oxide, silicon nitride, silicon oxynitride, or low-k dielectric materials.

In some embodiments, a plurality of the stacks ST may be provided. When viewed in the plan view of FIG. 5B, the stacks ST may be extended in the second direction D2 and may be spaced apart from each other in the third direction D3. The stacks ST may be spaced apart from each other in the third direction D3 by a first trench TR1, which will be described below. Hereinafter, just one stack ST will be described, for brevity's sake, but the others of the stacks ST may have substantially the same features as described below.

The stack ST may include a first stack ST1 and a second stack ST2. The first stack ST1 may include first interlayer insulating layers ILD1 and first gate electrodes GE1, which are alternately stacked on top of each other, and the second stack ST2 may include second interlayer insulating layers ILD2 and second gate electrodes GE2, which are alternately stacked on top of each other.

The first stack ST1 may be provided on the first substrate 10, and the second stack ST2 may be provided between the first stack ST1 and the first substrate 10. More specifically, the second stack ST2 may be provided on a bottom surface of the lowermost one of the first interlayer insulating layers ILD1 of the first stack ST1. The uppermost one of the second interlayer insulating layers ILD2 (i.e., the second interlayer insulating layer ILD2 farthest from the first substrate 10 among the second interlayer insulating layers ILD2) of the second stack ST2 may be in contact with the lowermost one of the first interlayer insulating layers ILD1 of the first stack ST1, but the inventive concept is not limited to this example. For example, a single interlayer insulating layer may be provided between the uppermost one of the second gate electrodes GE2 (i.e., the second gate electrode GE farthest from the first substrate 10 among the second gate electrodes GE2) of the second stack ST2 and the first gate electrodes GE1 of the first stack ST1.

The first and second gate electrodes GE1 and GE2 may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth). The first and second interlayer insulating layers ILD1 and ILD2 may be formed of or include at least one of silicon oxide, silicon nitride, silicon oxynitride, or low-k dielectric materials. For example, the first and second interlayer insulating layers ILD1 and ILD2 may be formed of or include high density plasma (HDP) oxide or tetraethylorthosilicate (TEOS).

The stack ST may have a staircase structure, which is provided in the second direction D2 on the cell array contact region EXR. For example, a thickness, in the first direction D1, of the stack ST on the cell array contact region EXR may decrease as a distance from the cell array region CAR increases. For the first and second gate electrodes GE1 and GE2, the larger the distance from the first substrate 10, the larger the length in the second direction D2. In the first and second gate electrodes GE1 and GE2, the lowermost one of the second gate electrodes GE2 may have the shortest length, and the uppermost one of the first gate electrodes GE1 (i.e., the first gate electrode GE1 farthest from the first substrate 10 among the first gate electrodes GE1) may have the longest length. The side surfaces of the first and second gate electrodes GE1 and GE2 may be spaced apart from each other by a specific distance in the second direction D2, when viewed in a plan view.

Each of the first and second gate electrodes GE1 and GE2 may include an extended portion EP, which is extended in the second direction D2, and a pad portion PAD, which is an end portion in the second direction D2. The pad portion PAD may be a portion of each of the first and second gate electrodes GE1 and GE2 constituting the staircase structure of the stack ST. In each of the first and second gate electrodes GE1 and GE2, a thickness of the pad portion PAD in the first direction D1 may be equal to or different from a thickness of the extended portion EP in the first direction D1. As an example, in each of the first and second gate electrodes GE1 and GE2, the thickness of the pad portion PAD in the first direction D1 may be larger than the thickness of the extended portion EP in the first direction D1.

The first and second interlayer insulating layers ILD1 and ILD2 may be provided between the first and second gate electrodes GE1 and GE2 and each of them may have a side surface that is aligned to one of the first and second gate electrodes GE1 and GE2 placed on or below thereof. That is, the larger the distance from the first substrate 10, the larger the lengths of the first and second interlayer insulating layers ILD1 and ILD2 in the second direction D2, similar to the first and second gate electrodes GE1 and GE2.

On the cell array region CAR, the first and second vertical channel structures VS1 and VS2 may penetrate the stack ST in the first direction D1. The first vertical channel structures VS1 may correspond to the memory channel structures 4220 of FIGS. 3 and 4. On the cell array contact region EXR, dummy vertical channel structures DVS may penetrate at least a portion of the stack ST and the third insulating layer 50 in the first direction D1. Each of the first and second vertical channel structures VS1 and VS2 may include a channel pad CHP which is provided near the second insulating layer 40. The first vertical channel structures VS1 may be electrically connected to the connection contact plugs 41 and the bit lines BL through the channel pads CHP.

The first, second, and dummy vertical channel structures VS1, VS2, and DVS may be provided to fill channel holes penetrating the stack ST. Each of the channel holes may include a first channel hole CH1 penetrating the first stack ST1 and a second channel hole CH2 penetrating the second stack ST2. As a distance from the first substrate 10 increases, a width of each of the first and second channel holes CH1 and CH2 in the second and/or third direction D2 and/or D3 may decrease. The first and second channel holes CH1 and CH2 may be connected to each other and may have different diameters from each other, near a boundary region where they are connected to each other. In detail, a diameter of an upper portion of the second channel hole CH2 may be smaller than a diameter of a lower portion of a first channel hole CH1. The first and second channel holes CH1 and CH2 may form a stepped structure near the boundary region. However, the inventive concept is not limited to this example, and in some embodiments, three or more channel holes may be provided to form the stepped structures near two or more boundaries, unlike that illustrated in the drawings. Alternatively, the channel holes may be provided to have a flat side surface without a stepped portion, unlike that illustrated in the drawings.

Referring to FIGS. 6A and 7, each of the first, second, and dummy vertical channel structures VS1, VS2, and DVS may include a data storage pattern DSP, which is provided to conformally cover an inner side surface of each of the first and second channel holes CH1 and CH2, a vertical semiconductor pattern VSP, which is provided to conformally cover a side surface of the data storage pattern DSP, and a gapfill insulating pattern VI, which is enclosed by the vertical semiconductor pattern VSP and the channel pad CHP and fills internal spaces of the first and second channel holes CH1 and CH2. The vertical semiconductor pattern VSP may be enclosed by the data storage pattern DSP. Bottom surfaces of the first, second, and dummy vertical channel structures VS1, VS2, and DVS may have a circular, elliptical, or bar shape.

The vertical semiconductor pattern VSP may be provided between the data storage pattern DSP and the gapfill insulating pattern VI and between the data storage pattern DSP and the channel pad CHP. The vertical semiconductor pattern VSP may have a top-closed pipe or macaroni structure. The data storage pattern DSP may have a top-opened pipe or macaroni structure. The vertical semiconductor pattern VSP may be formed of or include at least one of doped semiconductor materials or undoped or intrinsic semiconductor materials and may have a poly-crystalline structure. The channel pad CHP may be formed of or include a doped semiconductor material or a conductive material.

Referring to FIGS. 5A to 6B, a first trench TR1 and a second trench TR2 may be extended in the second direction D2. The stacks ST may be spaced apart from each other in the third direction D3 by the first trench TR1, and the second trench TR2 may be provided to cross the stack ST. The first trench TR1 may be extended from the cell array region CAR toward the cell array contact region EXR. The second trench TR2 may be provided in the cell array region CAR and may be extended along one row of the second vertical channel structures VS2, which are arranged in the second direction D2, or in the second direction D2. As a distance from the first substrate 10 increases, widths of the first and second trenches TR1 and TR2 in the third direction D3 may decrease.

A first separation pattern SS1 and a second separation pattern SS2 may be provided to fill the first trench TR1 and the second trench TR2, respectively. The first and second separation patterns SS1 and SS2 may correspond to the separation structures 4230 of FIGS. 3 and 4. A length of the first separation pattern SS1 in the second direction D2 may be larger than a length of the second separation pattern SS2 in the second direction D2. Side surfaces of the first and second separation patterns SS1 and SS2 may be in contact with at least some of the first and second gate electrodes GE1 and GE2 and the first and second interlayer insulating layers ILD1 and ILD2 of the stack ST. The first separation pattern SS1 may be provided between the stacks ST and may separate the stacks ST from each other in the third direction D3. In some embodiments, the first and second separation patterns SS1 and SS2 may be formed of or include at least one of silicon oxide, silicon nitride, silicon oxynitride, or low-k dielectric materials.

The second substrate 100 may be provided on the stack ST. The second substrate 100 may be formed of or include a single-crystalline semiconductor material (e.g., single-crystalline silicon), but in some embodiments, it may include a poly silicon layer.

The second substrate 100 may have a first surface 100a and a second surface 100b, which are opposite to each other. In some embodiments, the first and second surfaces 100a and 100b of the second substrate 100 may be front and rear surfaces of the second substrate 100, respectively. The stack ST may be provided on the first surface 100a of the second substrate 100. A fourth insulating layer 80, which will be described below, may be provided on the second surface 100b of the second substrate 100. A source structure SC may be provided between the first surface 100a of the second substrate 100 and the stack ST. The second substrate 100 and the source structure SC may be extended in the second direction D2 and the third direction D3. The second substrate 100 may be a plate-shaped structure that is extended parallel to the top surface of the first substrate 10. The source structure SC may correspond to the common source line 4205 of FIGS. 3 and 4.

The source structure SC may include a first source conductive pattern SCP1 between the stack ST and the second substrate 100 and a second source conductive pattern SCP2 between the stack ST and the first source conductive pattern SCP1. The second source conductive pattern SCP2 may be provided between the first source conductive pattern SCP1 and the uppermost one of the first interlayer insulating layers ILD1 (i.e., the first interlayer insulating layer ILD1 farthest from the first substrate 10 among first interlayer insulating layers ILD1) of the first stack ST1. The first source conductive pattern SCP1 may be in direct contact with the second source conductive pattern SCP2. A thickness of the first source conductive pattern SCP1 in the first direction D1 may be larger than a thickness of the second source conductive pattern SCP2 in the first direction D1. The source structure SC may be formed of or include at least one of doped semiconductor materials. The source structure SC may be formed of or include a semiconductor material that is doped to have the same conductivity type as the second substrate 100. For example, an impurity concentration of the first source conductive pattern SCP1 may be higher than an impurity concentration of the second source conductive pattern SCP2 and an impurity concentration of the second substrate 100.

FIG. 7 illustrates one of the first vertical channel structures VS1 including the data storage pattern DSP, the vertical semiconductor pattern VSP, and the gapfill insulating pattern VI, a portion of the source structure SC, and a portion of the second substrate 100. Hereinafter, one of the first vertical channel structures VS1 will be described, for brevity's sake, but the others of the first vertical channel structures VS1 and the second and dummy vertical channel structures VS2 and DVS may have substantially the same features as described below.

A top surface VS1t of the first vertical channel structure VS1 may be in contact with the second substrate 100. The top surface VS1t of the first vertical channel structure VS1 may be located at a level that is higher than a top surface SCP1b of the first source conductive pattern SCP1. In some embodiments, as shown, the first vertical channel structure VS1 may include an upper data storage pattern DSPr, which is located at a level higher than the first surface 100a of the second substrate 100, and the top surface VS1t of the first vertical channel structure VS1 may correspond to a top surface of the upper data storage pattern DSPr. In this case, the upper data storage pattern DSPr may be in contact with the second substrate 100. In some embodiments, although not shown, the first vertical channel structure VS1 may not include the upper data storage pattern DSPr, and the top surface VS It of the first vertical channel structure VS1 may correspond to the top surface of the vertical semiconductor pattern VSP. In this case, the first vertical channel structure VS1 may be in contact with the second substrate 100. As used herein, "level" may refer to a height from the first substrate 10 in the first direction D1.

The data storage pattern DSP may include a blocking insulating layer BLK, a charge storing layer CIL, and a tunneling insulating layer TIL, which are sequentially stacked on an inner side surface of a channel hole CH. The blocking insulating layer BLK may be adjacent to the stack ST or the source structure SC, and the tunneling insulating layer TIL may be adjacent to the vertical semiconductor pattern VSP. The charge storing layer CIL may be interposed between the blocking insulating layer BLK and the tunneling insulating layer TIL. The blocking insulating layer BLK, the charge storing layer CIL, and the tunneling insulating layer TIL may be extended from a region between the stack ST and the vertical semiconductor pattern VSP in the first direction D1. In some embodiments, the Fowler-Nordheim (FN) tunneling phenomenon, which is caused by a voltage difference between the vertical semiconductor pattern VSP and the first and second gate electrodes GE1 and GE2, may be used to store or change data in the data storage pattern DSP. In some embodiments, the blocking insulating layer BLK and the tunneling insulating layer TIL may be formed of or include silicon oxide, and the charge storing layer CIL may be formed of or include silicon nitride and/or silicon oxynitride.

The first source conductive pattern SCP1 of the source structure SC may be in contact with the vertical semiconductor pattern VSP, and the second source conductive pattern SCP2 may be spaced apart from the vertical semiconductor pattern VSP with the data storage pattern DSP interposed therebetween. The first source conductive pattern SCP1 may be spaced apart from the gapfill insulating pattern VI with the vertical semiconductor pattern VSP interposed therebetween.

More specifically, the first source conductive pattern SCP1 may include protruding portions SCP1p, which are located at a level that is lower than a top surface SCP2b of the second source conductive pattern SCP2 or is higher than the top surface SCP1b of the first source conductive pattern SCP1. However, the protruding portions SCP1p may be located at a level higher than a bottom surface SCP2a of the second source conductive pattern SCP2. For example, a surface of each protruding portion SCP1p, which is in contact with the data storage pattern DSP or the upper data storage pattern DSPr, may have a curved shape.

Referring to FIGS. 5A to 6B, cell contact plugs CCP, a source contact plug DCP, and a penetration contact plug TCP may be provided to penetrate the third insulating layer 50. The cell contact plugs CCP may be extended in the first direction D1 to connect the connection circuit interconnection lines 43 to the gate electrodes GE1 and GE2 of the stack ST. As an example, each of the cell contact plugs CCP may be in contact with the pad portion PAD of each of the gate electrodes GE1 and GE2, and in this case, it may be connected to a corresponding one of the gate electrodes GE1 and GE2. The source contact plug DCP may be extended in the first direction D1 to connect the connection circuit interconnection lines 43 to the source structure SC. The penetration contact plug TCP may be extended in the first direction D1 to connect the connection circuit interconnection lines 43 to a second gapfill conductive pattern BC2, which will be described below. The penetration contact plug TCP may be spaced apart from the stack ST in the second direction D2 and/or the third direction D3.

The cell contact plugs CCP, the source contact plug DCP, and the penetration contact plug TCP may be spaced apart from each other in the second direction D2. In some embodiments, as a distance from the first substrate 10 increases, widths of the cell contact plugs CCP, the source contact plug DCP, and the penetration contact plug TCP in the second direction D2 and/or the third direction D3 may decrease. In some other embodiment, although not shown, the cell contact plugs CCP, the source contact plug DCP, and the penetration contact plug TCP may be provided in holes, which have stepped portions near one or more boundaries, similar to the first vertical channel structure VS1. The cell contact plugs CCP, the source contact plug DCP, and the penetration contact plug TCP may be formed of or include at least one of titanium (Ti), tantalum (Ta), ruthenium (Ru), cobalt (Co), manganese (Mn), tungsten (W), nickel (Ni), and copper (Cu).

The penetration contact plug TCP may be provided to penetrate the third insulating layer 50 and a portion of the second substrate 100. For example, the penetration contact plug TCP may be provided to penetrate the third insulating layer 50 and the first surface 100a of the second substrate 100. A top surface of the penetration contact plug TCP may be located at a level higher than the first surface 100a of the second substrate 100. The second substrate 100 may include a front recess region FR, which is recessed from the first surface 100a, and an upper portion of the penetration contact plug TCP may be placed in the front recess region FR.

A front gapfill pattern FB may be provided in the front recess region FR to enclose the upper portion of the penetration contact plug TCP and may separate a side surface of the upper portion of the penetration contact plug TCP from the second substrate 100. A top surface of the front gapfill pattern FB may be located at substantially the same level as the top surface of the penetration contact plug TCP and may be substantially coplanar with the top surface of the penetration contact plug TCP. A bottom surface of the front gapfill pattern FB may be located at substantially the same level as the first surface 100a of the second substrate 100 and may be substantially coplanar with the first surface 100a of the second substrate 100. In some embodiments, the front gapfill pattern FB may include a single layer or a plurality of layers. The front gapfill pattern FB may be formed of or include at least one of silicon oxide, silicon nitride, silicon oxynitride, or low-k dielectric materials.

A fourth insulating layer 80 may be provided on the second surface 100b of the second substrate 100. The fourth insulating layer 80 may cover the second surface 100b of the second substrate 100. The fourth insulating layer 80 may include a single insulating layer or a plurality of insulating layers. For example, the fourth insulating layer 80 may be formed of or include at least one of silicon oxide, silicon nitride, silicon oxynitride, or low-k dielectric materials.

A gapfill conductive pattern BC may be provided to penetrate the fourth insulating layer 80 and the second substrate 100. For example, the gapfill conductive pattern BC may be provided to penetrate the fourth insulating layer 80 and the second surface 100b of the second substrate 100. A top surface of the gapfill conductive pattern BC may be located at substantially the same level as a top surface of the fourth insulating layer 80 and may be substantially coplanar with the top surface of the fourth insulating layer 80. A bottom surface of the gapfill conductive pattern BC may be located at a level, which is lower than the second surface 100b of the second substrate 100 and is higher than the first surface 100a. The second substrate 100 may include a rear recess region BR, which is recessed from the second surface 100b, and the gapfill conductive pattern BC may be placed in the rear recess region BR. The gapfill conductive pattern BC may be formed of or include a material having resistance lower than the second substrate 100. For example, the gapfill conductive pattern BC may be formed of or include at least one of titanium (Ti), tantalum (Ta), ruthenium (Ru), cobalt (Co), manganese (Mn), tungsten (W), nickel (Ni), and copper (Cu).

A gapfill spacer BS may be provided between a side surface of the gapfill conductive pattern BC and the second substrate 100 and may be extended into a space between the side surface of the gapfill conductive pattern BC and the fourth insulating layer 80. The gapfill spacer BS may separate the side surface of the gapfill conductive pattern BC from the second substrate 100 and may separate the side surface of the gapfill conductive pattern BC from the fourth insulating layer 80. The gapfill spacer BS may be provided to conformally cover an inner side surface of the rear recess region BR. The gapfill spacer BS may not cover an inner bottom surface of the rear recess region BR. The gapfill spacer BS may be provided to enclose the gapfill conductive pattern BC. The gapfill spacer BS may be formed of or include at least one of silicon oxide, silicon nitride, silicon oxynitride, or low-k dielectric materials.

Rear circuit interconnection lines 90 may be provided on the gapfill conductive pattern BC and may be connected to the gapfill conductive pattern BC. In some embodiments, a plurality of gapfill conductive patterns BC may be provided, and the rear circuit interconnection lines 90 may be connected to some of the gapfill conductive patterns BC. As an example, the rear circuit interconnection lines 90 may be connected to the second gapfill conductive patterns BC2, which are some of the gapfill conductive patterns BC. The rear circuit interconnection lines 90 may be surrounded by a fifth insulating layer (not shown). The rear circuit interconnection lines 90 may be formed of or include at least one of conductive materials (e.g., metallic materials).

The rear recess region BR may include a first rear recess region BR1 and a second rear recess region BR2. The gapfill conductive pattern BC may include a first gapfill conductive pattern BC1, which is placed in the first rear recess region BR1, and the second gapfill conductive pattern BC2, which is placed in the second rear recess region BR2. The gapfill spacer BS may include a first gapfill spacer BS1 enclosing the first gapfill conductive pattern BC1 and a second gapfill spacer BS2 enclosing the second gapfill conductive pattern BC2.

The first rear recess region BR1 may be spaced apart from the front recess region FR. The first gapfill conductive pattern BC1 may be spaced apart from the penetration contact plug TCP. A bottom surface BC1a of the first gapfill conductive pattern BC1 may be in contact with the second substrate 100. The first gapfill conductive pattern BC1 may be connected to the second substrate 100 through the bottom surface BC1a. A side surface BC1c of the first gapfill conductive pattern BC1 may be spaced apart from the second substrate 100 and the fourth insulating layer 80 by the first gapfill spacer BS1.

The second rear recess region BR2 may be vertically overlapped with the front recess region FR. The second gapfill conductive pattern BC2 may be vertically overlapped with the penetration contact plug TCP. A bottom surface BC2a of the second gapfill conductive pattern BC2 may be in contact with the penetration contact plug TCP. The second gapfill conductive pattern BC2 may be provided to electrically connect the penetration contact plug TCP to the rear circuit interconnection lines 90. A side surface BC2c of the second gapfill conductive pattern BC2 may be spaced apart from the second substrate 100 and the fourth insulating layer 80 by the second gapfill spacer BS2. As used herein, "an element A vertically overlapping an element B" (or similar language) means that that there is at least one line that extends in a vertical direction (e.g., the first direction D1) and intersects both the elements A and B.

The first gapfill conductive pattern BC1 may be formed of or include the same material as that in the second gapfill conductive pattern BC2. As an example, the second gapfill conductive pattern BC2 may be formed of or include at least one of titanium (Ti), tantalum (Ta), ruthenium (Ru), cobalt (Co), manganese (Mn), tungsten (W), nickel (Ni), and copper (Cu), and the first gapfill conductive pattern BC1 may be formed of or include the same material as the second gapfill conductive pattern BC2. In some embodiments, the first gapfill conductive pattern BC1 may further include an additional material, in addition to the same material as the second gapfill conductive pattern BC2.

According to some embodiments of the inventive concept, the first gapfill conductive pattern BC1, which has a lower resistance than the second substrate 100, may be formed in the second substrate 100. Thus, the first gapfill conductive pattern BC1 having the low resistance may be used as a part of a current path passing through the second substrate 100. As a result, it may be possible to improve the electrical characteristics of the three-dimensional semiconductor memory device including the first gapfill conductive pattern BC1.

Figure 8A:
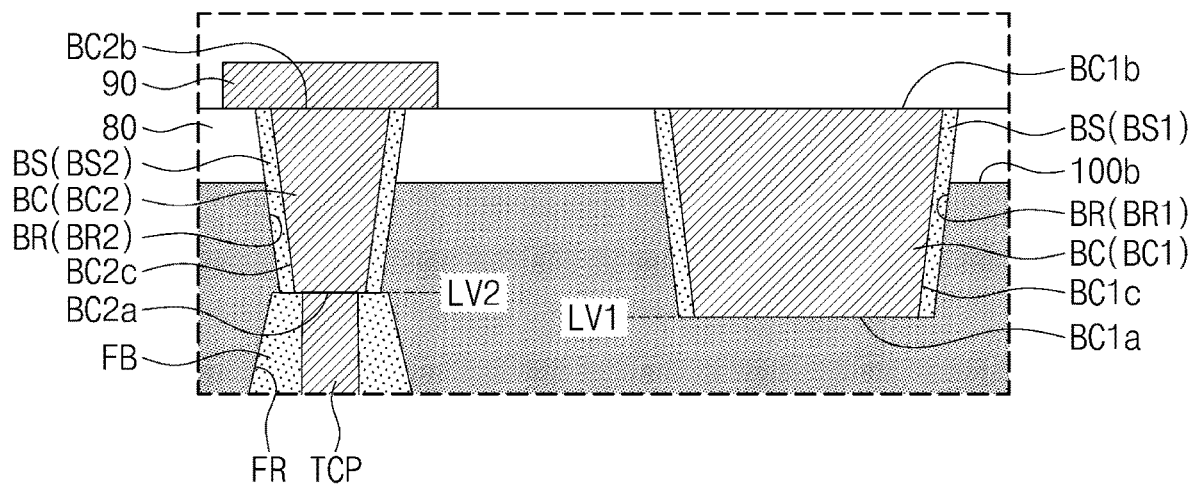
FIGS. 8A to 8D are enlarged sectional views, each of which illustrates a portion T2' of FIG. 6A according to some embodiments of the inventive concept.
Figure 8B:
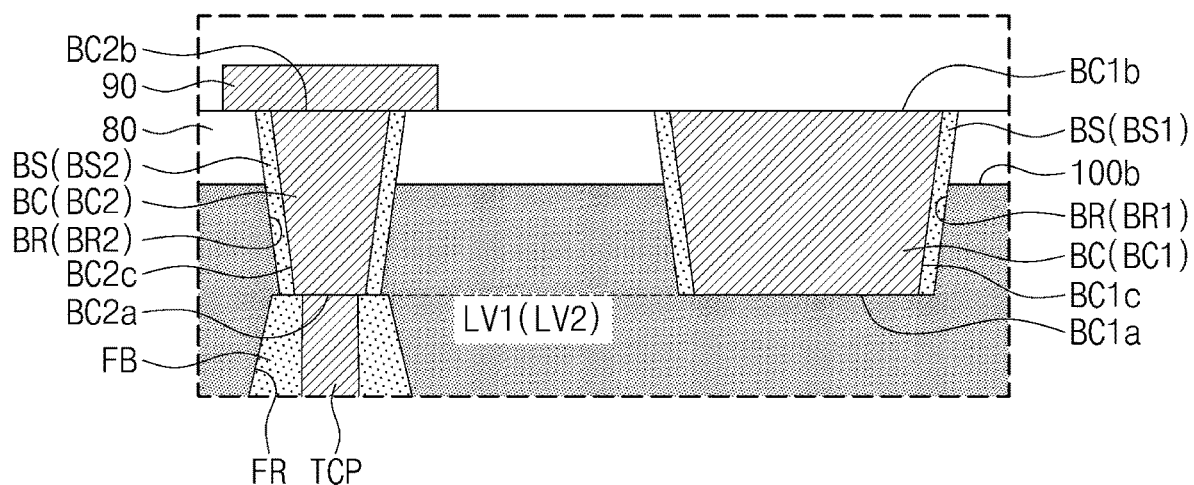
Figure 8C:
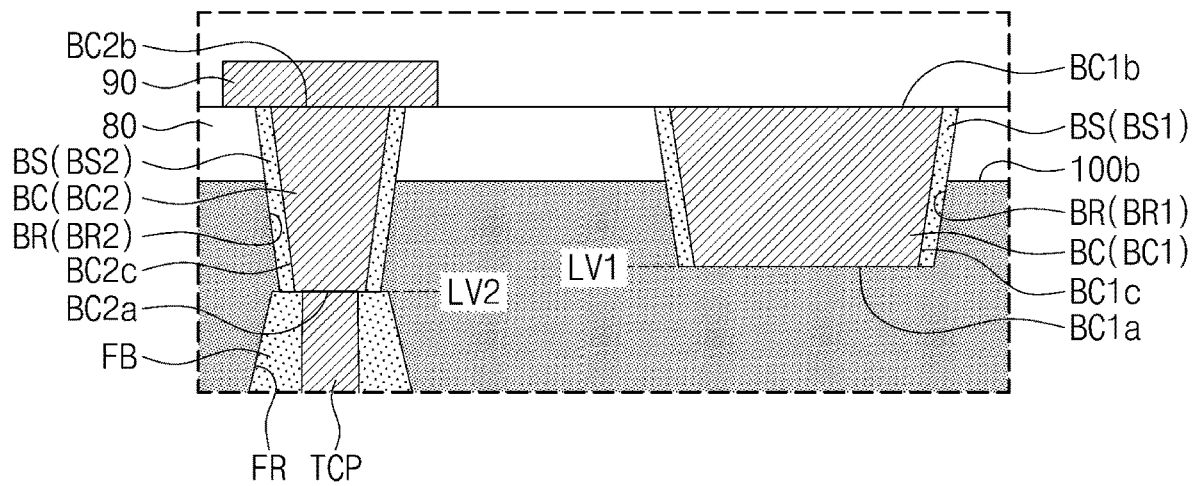

Referring to FIGS. 8A to 8C, a top surface BC1b of the first gapfill conductive pattern BC1 may be located at substantially the same level as a top surface BC2b of the second gapfill conductive pattern BC2. As an example, the top surface BC1b of the first gapfill conductive pattern BC1 and the top surface BC2b of the second gapfill conductive pattern BC2 may be located at substantially the same level as the top surface of the fourth insulating layer 80 and may be substantially coplanar with the top surface of the fourth insulating layer 80.

The bottom surface BC1a of the first gapfill conductive pattern BC1 may be located at a first level LV1, and the bottom surface BC2a of the second gapfill conductive pattern BC2 may be located at a second level LV2. The first level LV1 may be substantially equal to or different from the second level LV2.

In some embodiments, as shown in FIG. 8A, the first level LV1 may be lower than the second level LV2. In this case, the bottom surface BC1a of the first gapfill conductive pattern BC1 may be located at a level lower than the bottom surface BC2a of the second gapfill conductive pattern BC2. The bottom surface BC1a of the first gapfill conductive pattern BC1 may be located at a level lower than the top surface of the penetration contact plug TCP.

In some embodiments, as shown in FIG. 8B, the first level LV1 may be substantially equal to the second level LV2. Thus, the bottom surface BC1a of the first gapfill conductive pattern BC1 may be located at substantially the same level as the bottom surface BC2a of the second gapfill conductive pattern BC2. The bottom surface BC1a of the first gapfill conductive pattern BC1 may be located at substantially the same level as the top surface of the penetration contact plug TCP.

In some embodiments, as shown in FIG. 8C, the first level LV1 may be higher than the second level LV2. Thus, the bottom surface BC1a of the first gapfill conductive pattern BC1 may be located at a level higher than the bottom surface BC2a of the second gapfill conductive pattern BC2. The bottom surface BC1a of the first gapfill conductive pattern BC1 may be located at a level higher than the top surface of the penetration contact plug TCP.

Figure 8D:
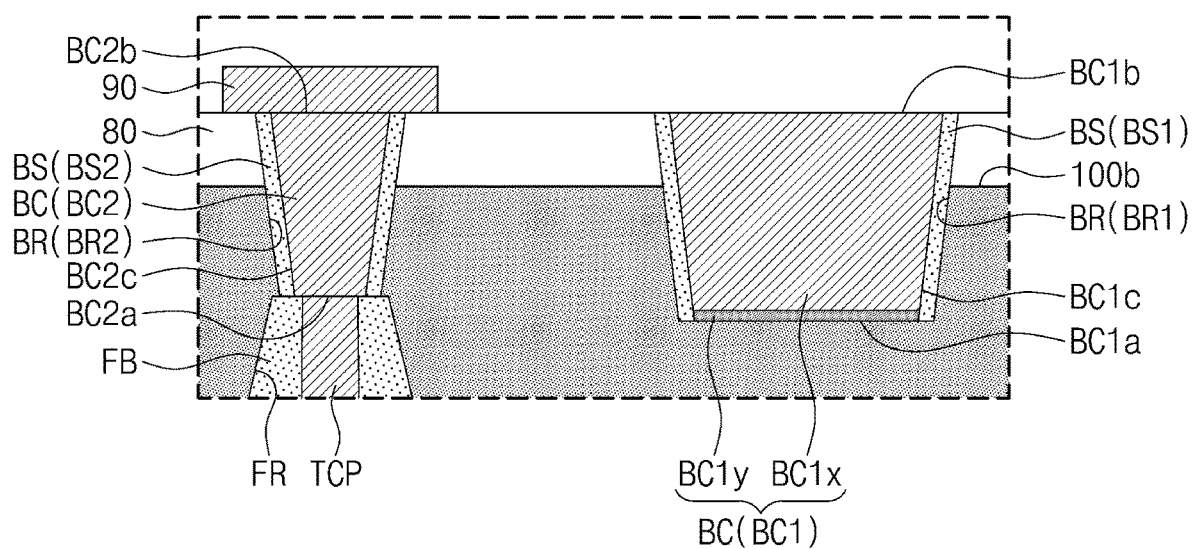

Referring to FIG. 8D, the first gapfill conductive pattern BC1 may include a first portion BC1x and a second portion BC1y. The first portion BC1x may constitute an upper portion of the first gapfill conductive pattern BC1, and the second portion BC1y may constitute a lower portion of the first gapfill conductive pattern BC1. The second portion BC1y may cover an inner bottom surface of the first rear recess region BR1 and may be in contact with the second substrate 100. The second portion BC1y may be interposed between the first portion BC1x and the second substrate 100. The first portion BC1x may be formed of or include the same material as the second gapfill conductive pattern BC2. In some embodiments, the second portion BC1y may include the same element as that in the first portion BC1x and an additional element. As an example, the first portion BC1x may be formed of or include at least one of titanium (Ti), tantalum (Ta), ruthenium (Ru), cobalt (Co), manganese (Mn), tungsten (W), nickel (Ni), and copper (Cu), and the second portion BC1y may be formed of or include a metal silicide material containing a metallic element in the first portion BC1x. Due to the presence of the second portion BC1y, the first gapfill conductive pattern BC1 and the second substrate 100 may form an ohmic contact structure. Thus, in the case where a current path is produced to pass through the second substrate 100, the first gapfill conductive pattern BC1 may be more effectively used as a part of the current path.

FIGS. 9A to 9D are plan views illustrating a three-dimensional semiconductor memory device according to some embodiments of the inventive concept. Hereinafter, a planar shape of the first gapfill conductive pattern BC1 will be described in more detail with reference to FIGS. 5A and 9A to 9D. For concise description, previously described element(s) may be identified by the same reference number(s) without repeating an overlapping description thereof.

Referring to FIGS. 5A and 9A to 9D, the first gapfill conductive pattern BC1 may be provided to have various shapes and various sizes, when viewed in a plan view. In some embodiments, a plurality of first gapfill conductive patterns BC1 may be provided, and in this case, the first gapfill conductive patterns BC1 may have the same planar shape or may have different planar shapes from each other. The first gapfill conductive patterns BC1 may be placed on the cell array region CAR and/or the cell array contact region EXR.

In some embodiments, as shown in FIG. 5A, each of the first gapfill conductive patterns BC1 may have a polygonal shape. As an example, each of the first gapfill conductive patterns BC1 may have a rectangular or tetragonal shape, but the inventive concept is not limited to this example. In some embodiments, although not shown, each of the first gapfill conductive patterns BC1 may have a polygonal shape, rather than the rectangular or tetragonal shape. The first gapfill conductive patterns BC1 may have the same polygonal shape or may have different polygonal shapes from each other.

In some embodiments, as shown in FIG. 9A, each of the first gapfill conductive patterns BC1 may have a line- or bar-shaped pattern that is extended in a specific direction (e.g., the second direction D2). Lengths and widths of the first gapfill conductive patterns BC1 may be the same as or different from each other. The first gapfill conductive patterns BC1 may be aligned to each other in the second direction D2 and/or the third direction D3 or may not be aligned to each other.

In some embodiments, as shown in FIG. 9B, each of the first gapfill conductive patterns BC1 may have a circular shape. Here, the circular shape should be interpreted as a shape including a circle with a constant curvature radius and an ellipse. As an example, the first gapfill conductive patterns BC1 may be circular patterns with the same radius, but the inventive concept is not limited to this example. For example, although not shown, the first gapfill conductive patterns BC1 may be circular patterns with different radii.

In some embodiments, as shown in FIG. 9C, the first gapfill conductive patterns BC1 may be disposed to have at least two different shapes. As an example, the first gapfill conductive patterns BC1 may include patterns of linear and circular shapes, but the inventive concept is not limited to this example. For example, the first gapfill conductive patterns BC1 may include at least one polygonal pattern and at least one pattern having a shape different therefrom.

In some embodiments, as shown in FIG. 9D, the first gapfill conductive patterns BC1 may include line- or bar-shaped patterns, which are extended in at least two different directions. As an example, some of the first gapfill conductive patterns BC1 may be extended in the second direction D2, and others may be extended in the third direction D3.

Some examples of the planar shape of the first gapfill conductive pattern BC1 have been described with reference to FIGS. 5A and 9A to 9D, but the inventive concept is not limited to these examples. To realize various embodiments according to the inventive concept, the planar shape of the first gapfill conductive pattern BC1 may be variously modified by a skilled person in the art.

FIGS. 10A to 14 are sectional views illustrating a method of fabricating a three-dimensional semiconductor memory device, according to some embodiments of the inventive concept. In detail, FIGS. 10A, 11A, 12A, 13A, and 14A are sectional views corresponding to the line A-A' or C-C' of FIG. 5A or 5B. FIGS. 10B, 11B, 12B, and 13B are sectional views corresponding to the line B-B' or D-D' of FIG. 5A or 5B. Hereinafter, a method of fabricating a three-dimensional semiconductor memory device according to some embodiments of the inventive concept will be described in more detail with reference to FIGS. 10A to 14. For concise description, previously described element(s) may be identified by the same reference number(s) without repeating an overlapping description thereof.

Figure 10A:
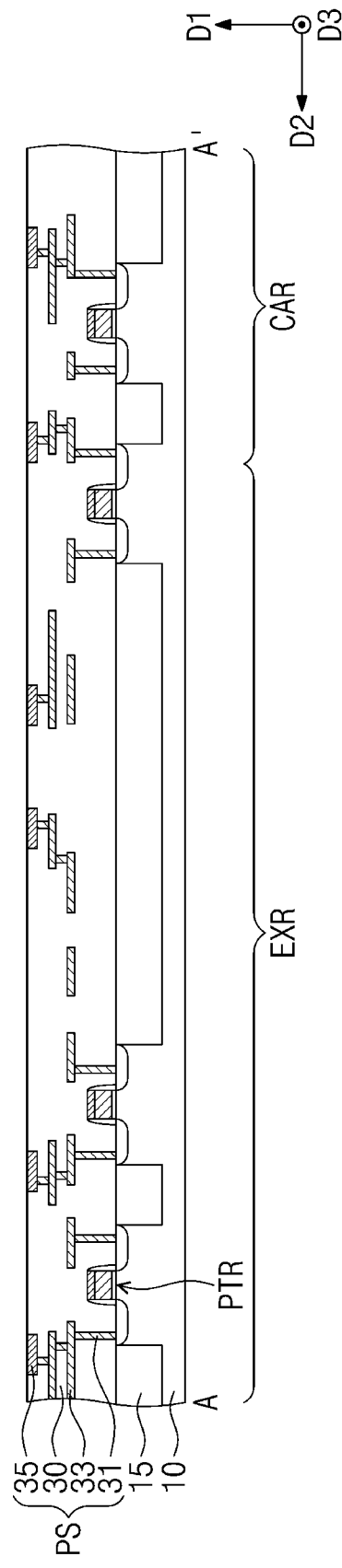
Figure 10B:
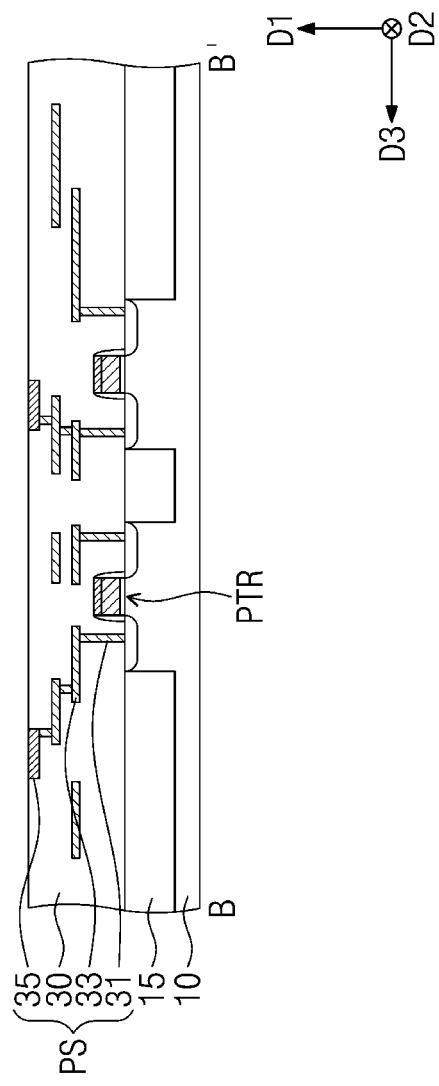
Figure 12A:
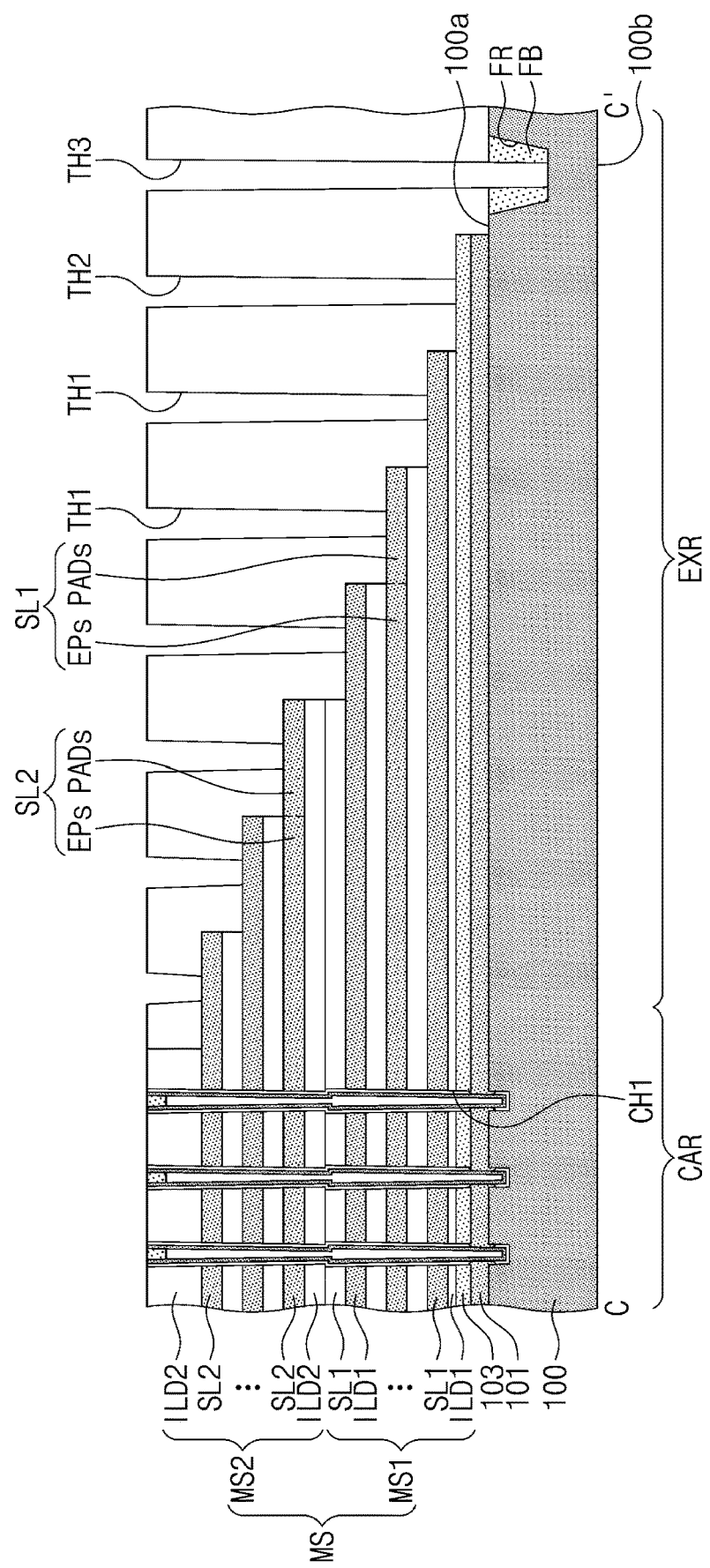
Figure 12B:
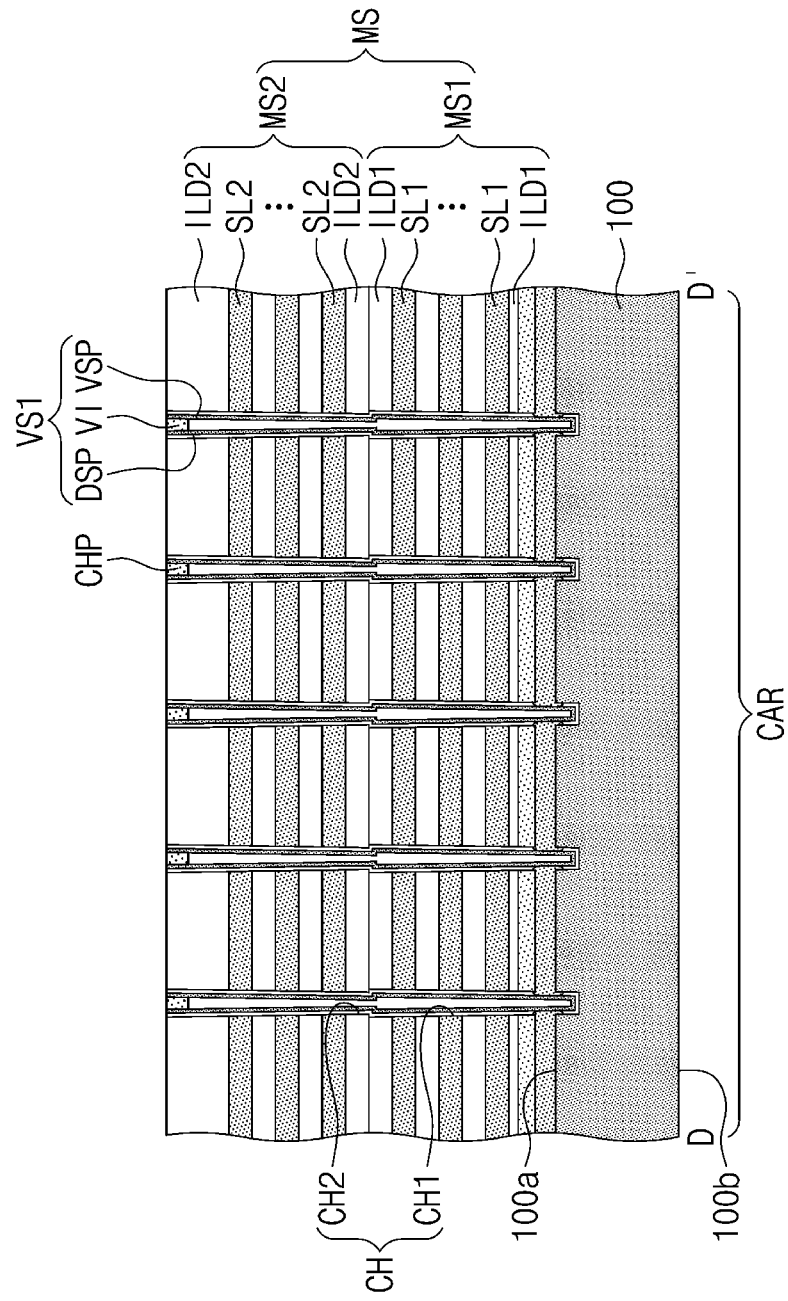
Figure 13A:
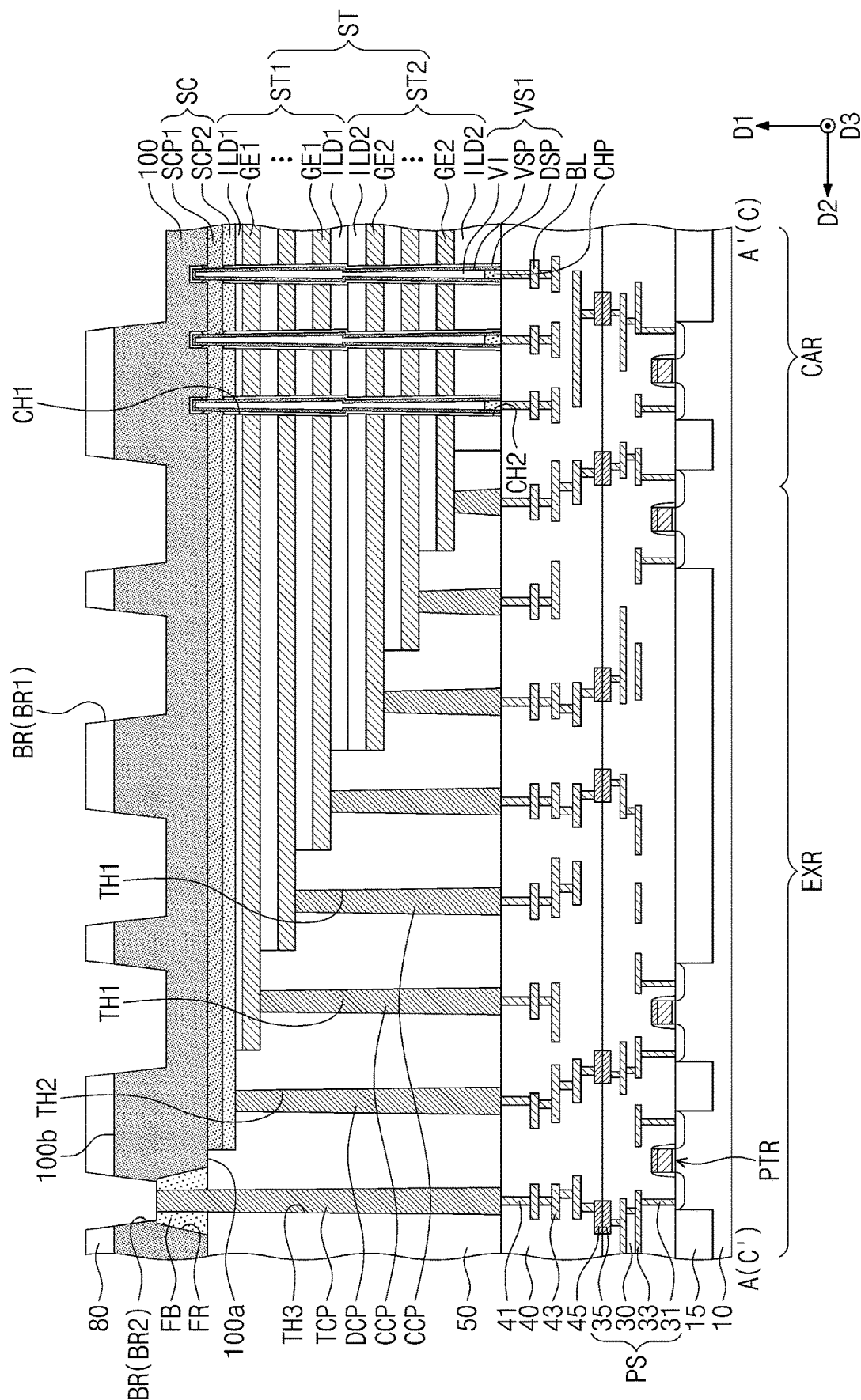
Figure 13B:
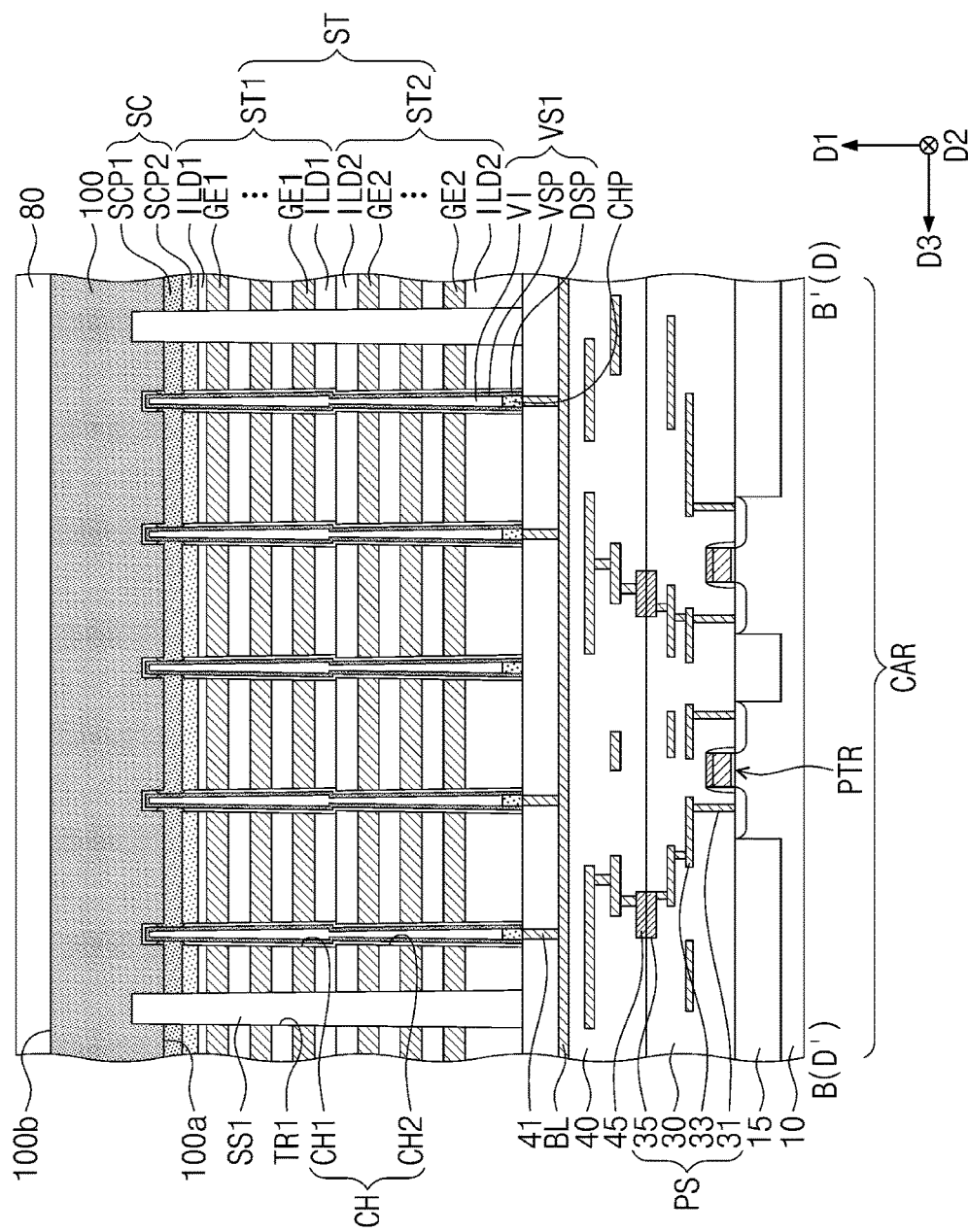

Referring to FIGS. 5B, 10A, and 10B, the peripheral circuit structure PS may be formed on the first substrate 10. The formation of the peripheral circuit structure PS may include forming the device isolation layer 15 in the first substrate 10, forming the peripheral transistors PTR on an active region of the first substrate 10 defined by the device isolation layer 15, and forming the peripheral contact plugs 31, the peripheral circuit interconnection lines 33, and the first bonding pads 35, which are electrically connected to the peripheral transistors PTR, and the first insulating layer 30 covering them.

Top surfaces of the first bonding pads 35 may be substantially coplanar with a top surface of the first insulating layer 30. In some embodiments, a planarization process may be performed to form the substantially coplanar surfaces. For example, the planarization process may be performed using a chemical mechanical polishing (CMP) process or an etch-back process.

In the following description of FIGS. 11A to 12B, the term "top surface" will be used to represent a "bottom surface" of a fabrication-completed structure of the three-dimensional semiconductor memory device described with reference to FIGS. 6A and 6B, the term "bottom surface" will be used to represent a "top surface" of the fabrication-completed structure. Similarly, the terms "upper and lower portions" will be used to represent "lower and upper portions" of the fabrication-completed structure, respectively.

Referring to FIGS. 5A, 5B, 11A, and 11B, the second substrate 100 may be provided. The second substrate 100 may have the first surface 100a and the second surface 100b, which are opposite to each other. In some embodiments, the first and second surfaces 100a and 100b of the second substrate 100 may be the front and rear surfaces of the second substrate 100, respectively.

The front recess region FR, which is recessed from the first surface 100a of the second substrate 100, may be formed. The formation of the front recess region FR may include forming a mask pattern (not shown) on the first surface 100a of the second substrate 100 and etching an upper portion of the second substrate 100 using the mask pattern as an etch mask.

Referring to FIGS. 5A, 5B, 12A, and 12B, the front gapfill pattern FB may be formed to fill the front recess region FR. In some embodiments, the formation of the front gapfill pattern FB may include forming a front gap-filling layer (not shown) to fill the front recess region FR and to cover the first surface 100a of the second substrate 100 and removing the front gap-filling layer from the first surface 100a of the second substrate 100, but the inventive concept is not limited to this example. For example, the removal of the front gap-filling layer may include performing an etch-back process or a chemical-mechanical polishing process.

A lower sacrificial layer 101, a lower semiconductor layer 103, and a mold structure MS may be formed on the second substrate 100. The lower sacrificial layer 101 may be formed of or include, for example, silicon nitride. In some embodiments, the lower sacrificial layer 101 may have a multi-layered structure including a plurality of insulating layers. The lower semiconductor layer 103 may be formed of or include at least one of doped semiconductor materials.

The formation of the mold structure MS may include forming a first mold structure MS1 and forming a second mold structure MS2 on the first mold structure MS1. The formation of the first mold structure MS1 may include sequentially stacking the first interlayer insulating layers ILD1 and first sacrificial layers SL1, forming the first channel holes CH1 to penetrate the first interlayer insulating layers ILD1 and the first sacrificial layers SL1 in the first direction D1, and filling the first channel holes CH1 with a channel sacrificial layer (not shown). The formation of the second mold structure MS2 may include sequentially stacking the second interlayer insulating layers ILD2 and second sacrificial layers SL2 on the first mold structure MS1 and forming the second channel holes CH2 to penetrate the second interlayer insulating layers ILD2 and the second sacrificial layers SL2 in the first direction D1. The second channel holes CH2 may be vertically overlapped with the first channel holes CH1, and in some embodiments, the second channel holes CH2 may be formed to expose the channel sacrificial layer filling the first channel holes CH1. Thereafter, the exposed channel sacrificial layer may be removed, and the first and second channel holes CH1 and CH2 may be formed to expose side surfaces of the first and second mold structures MS1 and MS2, respectively.

The first and second sacrificial layers SL1 and SL2 may be formed of or include a material that can be etched with an etch selectivity with respect to the first and second interlayer insulating layers ILD1 and ILD2. For example, the first and second sacrificial layers SL1 and SL2 may be formed of or include silicon nitride, and the first and second interlayer insulating layers ILD1 and ILD2 may be formed of or include silicon oxide. The first and second sacrificial layers SL1 and SL2 may have substantially the same thickness, and thicknesses of the first and second interlayer insulating layers ILD1 and ILD2 may vary depending on their vertical position.

Thereafter, the first, second, and dummy vertical channel structures VS1, VS2, and DVS may be formed to fill the first and second channel holes CH1 and CH2. The formation of the first, second, and dummy vertical channel structures VS1, VS2, and DVS may include forming the data storage pattern DSP and the vertical semiconductor pattern VSP to conformally cover inner side surfaces of the first and second channel holes CH1 and CH2, forming the gapfill insulating pattern VI in a space enclosed by the vertical semiconductor pattern VSP, and forming the channel pad CHP in a space enclosed by the gapfill insulating pattern VI and the data storage pattern DSP.

The first and second interlayer insulating layers ILD1 and ILD2 and the first and second sacrificial layers SL1 and SL2 on the cell array contact region EXR may be partially etched to form a stepped structure. For example, each of the first and second sacrificial layers SL1 and SL2 may be formed to include an extended portion EPs, which is extended in the second direction D2, and a pad portion PADs, which is an end portion in the second direction D2. Each of the extended portion EPs and the pad portion PADs of the first and second sacrificial layers SL1 and SL2 may be replaced with the extended portion EP and the pad portion PAD of the first and second gate electrodes GE1 and GE2, which were described with reference to FIGS. 6A and 6B, by subsequent processes.

In some embodiments, the formation of the stepped structure may include forming a mask pattern (not shown) and performing a process including steps of gradually reducing a width of the mask pattern and of sequentially etching the first second interlayer insulating layers ILD1 and ILD2 and the first and second sacrificial layers SL1 and SL2 thereunder.

In another embodiment, the formation of the stepped structure may include performing an etching step several times, and here, a process condition (e.g., an etching amount and an etching region) in each etching step may be changed. For example, in the case where the stepped structure is formed to have three stepped portions, a first etching step on regions for the uppermost and lowermost stepped portions may be performed under the condition of small etching amount, and a second etching step on regions for intermediate and lowermost stepped portions may be performed under the condition of large etching amount. In this case, the uppermost stepped portion, on which only the first etching step is performed, may be formed at a relatively high position, and the lowermost stepped portion, on which the first and second etching steps are performed, may be located at a relatively low position. The intermediate stepped portion, on which the second etching step is performed one time, may be located between the uppermost and lowermost stepped portions. However, the inventive concept is not limited to these examples.

The third insulating layer 50 may be formed to cover the staircase structure. Next, first to third penetration holes TH1, TH2, and TH3 may be formed on the cell array contact region EXR. The first to third penetration holes TH1, TH2, and TH3 may be formed to expose partially a side surface of the mold structure MS. The first penetration hole TH1 may be provided to penetrate the third insulating layer 50 and to expose the pad portion PADs of each of the first and second sacrificial layers SL1 and SL2. The second penetration hole TH2 may be formed to penetrate the third insulating layer 50 and to expose the lower semiconductor layer 103. The third penetration hole TH3 may be provided to penetrate the third insulating layer 50 and the front gapfill pattern FB and to expose the second substrate 100.

Referring to FIGS. 5A, 5B, 13A, and 13B, penetration sacrificial patterns (not shown) may be formed to fill the first to third penetration holes TH1, TH2, and TH3. The penetration sacrificial pattern may cover a portion of the side surface of the mold structure MS exposed by the first to third penetration holes TH1, TH2, and TH3. The penetration sacrificial pattern may be formed of or include at least one of silicon oxide, silicon nitride, silicon oxynitride, silicon carbide, or silicon germanium, but the inventive concept is not limited to this example.

The first and second trenches TR1 and TR2 may be formed to penetrate the mold structure MS in the first direction D1. The formation of the first and second trenches TR1 and TR2 may include anisotropically etching the mold structure MS. The first and second trenches TR1 and TR2 may be extended in the second direction D2. The first trench TR1 may be extended from the cell array region CAR toward the cell array contact region EXR. The second trench TR2 may be provided in the cell array region CAR and may be extended along one row of the second vertical channel structures VS2, which are arranged in the second direction D2, or in the second direction D2. The first and second trenches TR1 and TR2 may be formed to expose the side surface of the mold structure MS, and in some embodiments, side surfaces of the first and second sacrificial layers SL1 and SL2 may be exposed to the first and second trenches TR1 and TR2. The first and second trenches TR1 and TR2 may be formed to expose the lower sacrificial layer 101 to the outside.

Next, a process may be performed to replace the lower sacrificial layer 101 on the cell array region CAR with the first source conductive pattern SCP1. The formation of the first source conductive pattern SCP1 may include performing an isotropic etching process on the exposed lower sacrificial layer 101. The data storage pattern DSP may be partially and isotropically etched during the isotropic etching process, and thus, a portion of the vertical semiconductor pattern VSP described with reference to FIG. 7 may be exposed. Thereafter, the first source conductive pattern SCP1 may be formed by depositing a doped poly silicon layer. Here, a remaining portion of the lower semiconductor layer 103 may be referred to as the second source conductive pattern SCP2, and the first and second source conductive patterns SCP1 and SCP2 may constitute the source structure SC. The source structure SC may be formed between the first surface 100a of the second substrate 100 and the mold structure MS.

After the formation of the source structure SC, the first and second sacrificial layers SL1 and SL2 may be replaced with the first and second gate electrodes GE1 and GE2. The formation of the first and second gate electrodes GE1 and GE2 may include performing an isotropic etching process on the first and second sacrificial layers SL1 and SL2 exposed through the first and second trenches TR1 and TR2 to form empty spaces and forming the first and second gate electrodes GE1 and GE2 in the empty spaces using a deposition technique. As a result, the first stack ST1, which is composed of the first gate electrodes GE1 and the first interlayer insulating layers ILD1, and the second stack ST2, which is composed of the second gate electrodes GE2 and the second interlayer insulating layers ILD2, may be formed. The first and second stacks ST1 and ST2 may constitute the stack ST. Thereafter, the first and second trenches TR1 and TR2 may be filled with an insulating material, and as a result, the first and second separation patterns SS1 and SS2 may be formed.

The cell contact plugs CCP, the source contact plug DCP, and the penetration contact plug TCP may be formed on the cell array contact region EXR. The formation of the cell contact plug CCP, the source contact plug DCP, and the penetration contact plug TCP may include removing the penetration sacrificial pattern from the first to third penetration holes TH1, TH2, and TH3 and forming the cell contact plug CCP, the source contact plug DCP, and the penetration contact plug TCP to fill the first to third penetration holes TH1, TH2, and TH3. The cell contact plug CCP may fill the first penetration hole TH1. The source contact plug DCP may fill the second penetration hole TH2. The penetration contact plug TCP may fill the third penetration hole TH3.

The second insulating layer 40, the connection contact plugs 41, the connection circuit interconnection lines 43, and the second bonding pads 45 may be formed on the stack ST and the third insulating layer 50. The connection contact plugs 41, the connection circuit interconnection lines 43, and the second bonding pads 45 may be electrically connected to each other, and the second insulating layer 40 may be formed to enclose them. The second insulating layer 40 may include one or more layers, which are independently formed in different steps, and in some embodiments, the second insulating layer 40 may be formed in various steps, regardless of the formation of the connection contact plugs 41, the connection circuit interconnection lines 43, and the second bonding pads 45 in time. A surface of the second bonding pad 45 may not be covered with the second insulating layer 40 and may be exposed to the outside.

Thereafter, the structure, which is formed on the second substrate 100, may be bonded to the peripheral circuit structure PS, which is formed on the first substrate 10 by the method described with reference to FIGS. 10A and 10B. In more detail, the second substrate 100 and the peripheral circuit structure PS may be bonded such that the first surface 100a faces the peripheral circuit structure PS. The first and second bonding pads 35 and 45 may be in contact with each other and may be fused into one.

In the following description of remaining subsequent steps to be performed after the bonding step, the terms "top surface", "bottom surface", "upper portion", and "lower portion" will be used to represent the top surface, the bottom surface, the upper portion, and the lower portion described with reference to FIGS. 6A and 6B.

The rear recess region BR, which is recessed from the second surface 100b of the second substrate 100, may be formed. The formation of the rear recess region BR may include sequentially forming the fourth insulating layer 80 and a mask pattern (not shown) on the second surface 100b of the second substrate 100 and etching the fourth insulating layer 80 and an upper portion of the second substrate 100 using the mask pattern as an etch mask. The rear recess region BR may include the first rear recess region BR1 and the second rear recess region BR2. The first rear recess region BR1 may be formed to be spaced apart from the front recess region FR and may expose the second substrate 100. The second rear recess region BR2 may be vertically overlapped with the front recess region FR and may expose the penetration contact plug TCP.

Figure 14:
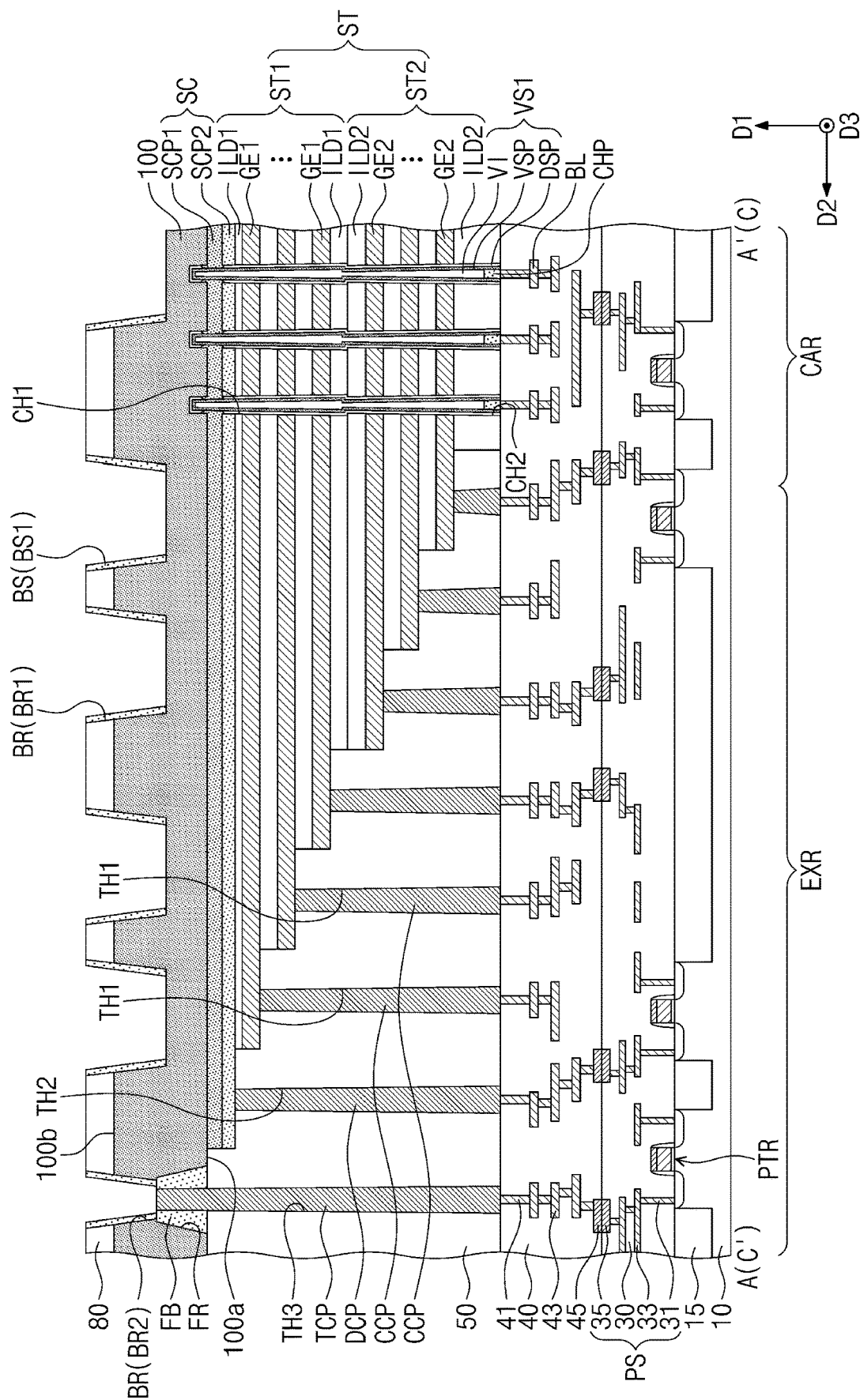

Referring to FIGS. 5A, 5B, and 14, the gapfill spacer BS may be formed to conformally cover the inner side surface of the rear recess region BR. The formation of the gapfill spacer BS may include forming a gapfill spacer layer (not shown), which conformally covers the inner surface of the rear recess region BR and is extended to a region on the top surface of the fourth insulating layer 80, and etching portions of the gapfill spacer layer covering the inner bottom surface of the rear recess region BR and the top surface of the fourth insulating layer 80. A remaining portion of the gapfill spacer layer, which is left after the etching process, may constitute the gapfill spacer BS. The etching process may be performed to expose the inner bottom surface of the rear recess region BR and the top surface of the fourth insulating layer 80 to the outside.

Referring back to FIGS. 5A, 5B, 6A, and 6B, the gapfill conductive pattern BC may be formed to fill a remaining portion of the rear recess region BR. In some embodiments, the formation of the gapfill conductive pattern BC may include forming a gapfill conductive layer (not shown) to fill the remaining portion of the rear recess region BR and to cover the top surface of the fourth insulating layer 80 and etching a portion of the gapfill conductive layer covering the top surface of the fourth insulating layer 80. A remaining portion of the gapfill conductive layer, which is left in the rear recess region BR after the etching process, may constitute the gapfill conductive pattern BC.

The first and second gapfill conductive patterns BC1 and BC2 may be formed simultaneously through the process of forming the gapfill conductive pattern BC. That is, it may be possible to form the first and second gapfill conductive patterns BC1 and BC2 together, without an additional step in the fabrication process. The absence of the additional step may make it possible to perform the fabrication process in a simplified and easy manner, and the presence of the first gapfill conductive pattern BC1 may make it possible to fabricate a three-dimensional semiconductor memory device with improved electrical characteristics.

According to some embodiments of the inventive concept, a gapfill conductive pattern having a low resistance may be formed in a substrate. Accordingly, the gapfill conductive pattern may be used as a current path passing through the substrate. As a result, it may be possible to improve electrical characteristics of a three-dimensional semiconductor memory device.

In addition, the gapfill conductive pattern may not require an additional process. Accordingly, it may be possible to realize a three-dimensional semiconductor memory device, which has improved electrical characteristics and can be easily fabricated.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

As used herein, an element or region that is "covering" or "surrounding" or "filling" another element or region may completely or partially cover or surround or fill the other element or region. Further, "an element A connected to an element B" (or similar language) may mean that the element A is electrically connected to the element B and/or the element A contacts the element B.

While example embodiments of the inventive concept have been particularly shown and described, it will be understood by one of ordinary skill in the art that variations in form and detail may be made therein without departing from the scope of the attached claims.

What is claimed is:

1. A three-dimensional semiconductor memory device comprising:
    a peripheral circuit structure on a first substrate; and
    a cell array structure on the peripheral circuit structure, wherein the cell array structure comprises:
    a second substrate having a first surface and a second surface, which are opposite to each other;
    a stack including gate electrodes, which are stacked on the first surface of the second substrate in a first direction;
    an insulating layer on the second surface of the second substrate;
    a penetration contact plug extending through the first surface of the second substrate;
    a first gapfill conductive pattern extending through the second surface of the second substrate and the insulating layer and spaced apart from the penetration contact plug;
    a second gapfill conductive pattern extending through the second surface of the second substrate and the insulating layer and connected to the penetration contact plug;
    a first gapfill spacer between the first gapfill conductive pattern and the second substrate; and
    a second gapfill spacer between the second gapfill conductive pattern and the second substrate.

2. The three-dimensional semiconductor memory device of claim 1, wherein a top surface of the first gapfill conductive pattern is located at substantially the same level as a top surface of the second gapfill conductive pattern.

3. The three-dimensional semiconductor memory device of claim 1, wherein a portion of the second substrate separates the first gapfill conductive pattern from the stack.

4. The three-dimensional semiconductor memory device of claim 1, wherein the first gapfill spacer extends between the first gapfill conductive pattern and the insulating layer, and
    the second gapfill spacer extends between the second gapfill conductive pattern and the insulating layer.

5. The three-dimensional semiconductor memory device of claim 1, wherein the first gapfill conductive pattern has a circular, polygonal, linear, or bar shape, when viewed in a plan view.

6. The three-dimensional semiconductor memory device of claim 1, wherein the first gapfill conductive pattern comprises a plurality of first gapfill conductive patterns, and
the first gapfill conductive patterns have the same shape or different shapes, when viewed in a plan view.

7. The three-dimensional semiconductor memory device of claim 1, wherein a side surface of the first gapfill conductive pattern is spaced apart from the second substrate by the first gapfill spacer.

8. The three-dimensional semiconductor memory device of claim 1, wherein a bottom surface of the first gapfill conductive pattern is in contact with the second substrate.

9. The three-dimensional semiconductor memory device of claim 1, wherein the first gapfill conductive pattern comprises the same material as that in the second gapfill conductive pattern.

10. The three-dimensional semiconductor memory device of claim 9, wherein the first gapfill conductive pattern further comprises a metal silicide.

11. A three-dimensional semiconductor memory device comprising:
a peripheral circuit structure on a first substrate; and
a cell array structure on the peripheral circuit structure,
wherein the cell array structure comprises:
a second substrate having a first surface and a second surface, which are opposite to each other;
a stack including gate electrodes, which are stacked on the first surface of the second substrate in a first direction;
an insulating layer on the second surface of the second substrate; and
a gapfill conductive pattern extending through the second surface of the second substrate and the insulating layer,
wherein a side surface of the gapfill conductive pattern is spaced apart from the second substrate, and
a bottom surface of the gapfill conductive pattern is in contact with the second substrate.

12. The three-dimensional semiconductor memory device of claim 11, wherein a top surface of the gapfill conductive pattern is substantially coplanar with a top surface of the insulating layer.

13. The three-dimensional semiconductor memory device of claim 11, wherein the gapfill conductive pattern has a circular, polygonal, linear, or bar shape, when viewed in a plan view.

14. The three-dimensional semiconductor memory device of claim 11, wherein the gapfill conductive pattern comprises a plurality of gapfill conductive patterns, and
the gapfill conductive patterns have the same shape or different shapes, when viewed in a plan view.

15. The three-dimensional semiconductor memory device of claim 11, further comprising a penetration contact plug extending through the first surface of the second substrate,
wherein the gapfill conductive pattern is spaced apart from the penetration contact plug.

16. The three-dimensional semiconductor memory device of claim 11, further comprising a gapfill spacer between the side surface of the gapfill conductive pattern and the second substrate,
wherein the side surface of the gapfill conductive pattern is spaced apart from the second substrate by the gapfill spacer.

17. The three-dimensional semiconductor memory device of claim 11, wherein the gapfill conductive pattern comprises at least one of titanium, tantalum, ruthenium, cobalt, manganese, tungsten, nickel, and copper.

18. The three-dimensional semiconductor memory device of claim 17, wherein the gapfill conductive pattern further comprises a metal silicide.

19. An electronic system comprising:
a three-dimensional semiconductor memory device including a peripheral circuit structure on a first substrate and a cell array structure on the peripheral circuit structure; and
a controller, which is electrically connected to the three-dimensional semiconductor memory device through an input/output pad and is configured to control the three-dimensional semiconductor memory device,
wherein the cell array structure comprises:
a second substrate having a first surface and a second surface, which are opposite to each other;
a stack including gate electrodes, which are stacked on the first surface of the second substrate in a first direction;
an insulating layer on the second surface of the second substrate;
a penetration contact plug extending through the first surface of the second substrate;
a first gapfill conductive pattern extending through the second surface of the second substrate and the insulating layer and spaced apart from the penetration contact plug;
a second gapfill conductive pattern extending through the second surface of the second substrate and the insulating layer and connected to the penetration contact plug;
a first gapfill spacer between the first gapfill conductive pattern and the second substrate; and
a second gapfill spacer between the second gapfill conductive pattern and the second substrate.

20. The electronic system of claim 19, wherein a side surface of the first gapfill conductive pattern is spaced apart from the second substrate, and
a bottom surface of the first gapfill conductive pattern is in contact with the second substrate.

* * * * *